(12) United States Patent
Lee et al.

(10) Patent No.: US 9,595,496 B2
(45) Date of Patent: Mar. 14, 2017

(54) INTEGRATED DEVICE PACKAGE COMPRISING SILICON BRIDGE IN AN ENCAPSULATION LAYER

(71) Applicant: QUALCOMM Incorporated, San Diego, CA (US)

(72) Inventors: Jae Sik Lee, San Diego, CA (US); Hong Bok We, San Diego, CA (US); Dong Wook Kim, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 64 days.

(21) Appl. No.: 14/535,966

(22) Filed: Nov. 7, 2014

(65) Prior Publication Data

US 2016/0133571 A1    May 12, 2016

(51) Int. Cl.
*H01L 23/02*    (2006.01)
*H01L 21/44*    (2006.01)
(Continued)

(52) U.S. Cl.
CPC .......... *H01L 23/5389* (2013.01); *H01L 21/56* (2013.01); *H01L 21/768* (2013.01); *H01L 23/3107* (2013.01); *H01L 23/5381* (2013.01); *H01L 23/5383* (2013.01); *H01L 23/5384* (2013.01); *H01L 23/5385* (2013.01);
(Continued)

(58) Field of Classification Search
CPC ............. H01L 23/5389; H01L 23/3107; H01L 23/5381; H01L 23/5386; H01L 23/5384; H01L 23/5383; H01L 23/49816; H01L 23/3128; H01L 23/49827; H01L 23/481; H01L 23/50
See application file for complete search history.

(56) References Cited

U.S. PATENT DOCUMENTS 6,734,542 B2    5/2004  Nakatani et al.
7,589,426 B2    9/2009  Jiang et al.
(Continued)

FOREIGN PATENT DOCUMENTS

DE    202014103794 U1    10/2014

OTHER PUBLICATIONS

International Search Report and Written Opinion—PCT/US2015/059336—ISA/EPO—Jan. 25, 2016.

*Primary Examiner* — (Vikki) Hoa B Trinh
(74) *Attorney, Agent, or Firm* — Loza & Loza, LLP

(57) ABSTRACT

Some novel features pertain to an integrated device package that includes an encapsulation portion and a redistribution portion. The encapsulation portion includes a first die, a first set of vias coupled to the first die, a second die, a second set of vias coupled to the second die, a bridge, and an encapsulation layer. The bridge is configured to provide an electrical path between the first die and the second die. The bridge is coupled to the first die through the first set of vias. The bridge is further coupled to the second die through the second set of vias. The encapsulation layer at least partially encapsulates the first die, the second die, the bridge, the first set of vias, and the second set of vias. The redistribution portion is coupled to the encapsulation portion. The redistribution portion includes a set of redistribution interconnects, and at least one dielectric layer.

21 Claims, 17 Drawing Sheets

(51) Int. Cl.
H01L 23/538 (2006.01)
H01L 23/00 (2006.01)
H01L 21/768 (2006.01)
H01L 23/31 (2006.01)
H01L 25/065 (2006.01)
H01L 25/00 (2006.01)
H01L 21/56 (2006.01)

(52) U.S. Cl.
CPC .......... *H01L 23/5386* (2013.01); *H01L 24/19* (2013.01); *H01L 25/0655* (2013.01); *H01L 25/50* (2013.01); H01L 21/568 (2013.01); H01L 2224/04105 (2013.01); H01L 2224/12105 (2013.01); H01L 2224/13147 (2013.01); H01L 2224/16227 (2013.01); H01L 2224/73209 (2013.01); H01L 2224/81005 (2013.01); *H01L 2224/92124* (2013.01); *H01L 2924/15192* (2013.01); *H01L 2924/18162* (2013.01)

(56) References Cited

U.S. PATENT DOCUMENTS

| | | |
|---|---|---|
| 2006/0226527 A1 | 10/2006 | Hatano et al. |
| 2013/0040423 A1 | 2/2013 | Tung et al. |
| 2013/0256000 A1 | 10/2013 | Terui et al. |
| 2014/0117552 A1 | 5/2014 | Qian et al. |
| 2014/0131854 A1 | 5/2014 | Hawk et al. |
| 2014/0159228 A1 | 6/2014 | Teh et al. |
| 2014/0174807 A1 | 6/2014 | Roy et al. |
| 2014/0175673 A1* | 6/2014 | Kim .................. H01L 24/73 257/777 |
| 2014/0264337 A1 | 9/2014 | Chen et al. |
| 2014/0264791 A1 | 9/2014 | Manusharow et al. |

* cited by examiner

INTEGRATED DEVICE PACKAGE COMPRISING SILICON BRIDGE IN AN ENCAPSULATION LAYER

BACKGROUND

Field

Various features relate to an integrated device package that includes a silicon bridge in an encapsulation layer.

Background

FIG. 1 illustrates a conventional configuration of an integrated package that includes multiple dies. Specifically, FIG. 1 illustrates an integrated package 100 that includes a package substrate 104, a first die 106, and a second die 108. The integrated package 100 is coupled to a printed circuit board (PCB) 102 through a first set of solder balls 105. The first die 106 is coupled to the package substrate 104 through a second set of solder balls 107. The second die 108 is coupled to the package substrate 104 through a third set of solder balls 109. The package substrate 104 includes one or more dielectric layers 110, and a set of interconnects 112 (e.g., traces and vias). The set of interconnects 112 is coupled to the first, second, and third set of solder balls 105, 107, and 109. The first die 106 and the second die 108 may be electrically coupled to each other through the second set of solder balls 107, the set of interconnects 112, and the third set of solder balls 109.

One drawback of the integrated package 100 shown in FIG. 1 is that it creates an integrated package with a form factor that may be too large for the needs of mobile computing devices. This may result in a package that is either too large and/or too thick. That is, the integrated package configuration shown in FIG. 1 may be too thick and/or have a surface area that is too large to meet the needs and/or requirements of mobile computing devices.

Another drawback of the integrated package 100 is that the configuration of the set of interconnects 112 does not provide high density interconnects between the first die 106 and the second 108. This greatly limits the number of interconnects that can exist between the first and second dies 106 and 108, thus limiting the communication bandwidth between the first and second dies 106 and 108.

Therefore, there is a need for an integrated package that includes high density interconnects between dies. Ideally, such an integrated package will have a better form factor, while at the same time meeting the needs and/or requirements of mobile computing devices.

SUMMARY

Various features, apparatus and methods described herein an integrated device package that includes a silicon bridge in an encapsulation layer.

A first example provides an integrated device package that includes an encapsulation portion and a redistribution portion. The encapsulation portion includes a first die, a first set of vias coupled to the first die, a second die, a second set of vias coupled to the second die, a bridge, and an encapsulation layer that at least partially encapsulates the first die, the second die, the bridge, the first set of vias, and the second set of vias. The bridge is configured to provide an electrical path between the first die and the second die. The bridge is coupled to the first die through the first set of vias. The bridge is further coupled to the second die through the second set of vias. The redistribution portion is coupled to the encapsulation portion. The redistribution portion includes a set of redistribution interconnects, and at least one dielectric layer.

According to an aspect, the bridge includes a set of bridge interconnects comprising a bridge interconnect density.

According to one aspect, the bridge interconnect density of the set of bridge interconnects comprises a width of about 2 microns ($\mu m$) or less, and/or a spacing of about 2 microns ($\mu m$) or less.

According to an aspect, the electrical path between the first die and the second die comprises the set of bridge interconnects in the bridge, the first set of vias and the second set of vias.

According to one aspect, the set of bridge interconnects comprises one of at least a trace, a via, and/or a pad.

According to an aspect, the integrated device package further includes a third set of vias coupled to the first die and the set of redistribution interconnects, and a fourth set of vias coupled to the second die and the set of redistribution interconnects.

According to one aspect, the third set of vias and the fourth set of vias comprises a via density that is greater than a bridge interconnect density of the bridge.

According to an aspect, the encapsulation layer includes a photosensitive material.

According to one aspect, the integrated device package is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an integrated device package that includes an encapsulation portion and a redistribution portion. The encapsulation portion includes a first die, a first set of vias coupled to the first die, a second die, a second set of vias coupled to the second die, a bridge means; and an encapsulation layer that at least partially encapsulates the first die, the second die, the bridge means, the first set of vias, and the second set of vias. The bridge means is configured to provide an electrical path between the first die and the second die. The bridge means is coupled to the first die through the first set of vias. The bridge means is further coupled to the second die through the second set of vias. The redistribution portion is coupled to the encapsulation portion. The redistribution portion includes a set of redistribution interconnects and at least one dielectric layer.

According to an aspect, the bridge means comprises a set of bridge interconnects comprising a bridge interconnect density.

According to one aspect, the bridge interconnect density of the set of bridge interconnects comprises a width of about 2 microns ($\mu m$) or less, and/or a spacing of about 2 microns ($\mu m$) or less.

According to an aspect, the electrical path between the first die and the second die comprises the set of bridge interconnects in the bridge means, the first set of vias and the second set of vias.

According to one aspect, the set of bridge interconnects comprises one of at least a trace, a via, and/or a pad.

According to an aspect, the integrated device package further includes a third set of vias coupled to the first die and the set of redistribution interconnects, and a fourth set of vias coupled to the second die and the set of redistribution interconnects.

According to one aspect, the third set of vias and the fourth set of vias comprises a via density that is greater than a bridge interconnect density of the bridge means.

According to an aspect, the encapsulation layer includes a photosensitive material.

According to one aspect, the integrated device package is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for fabricating an integrated device package. The method provides an encapsulation portion. Providing the encapsulation portion includes providing a first die comprising a first set of vias. Providing the encapsulation portion also includes provides a second die comprising a second set of vias. Providing the encapsulation portion further includes coupling a bridge to the first die and the second die. The bridge is configured to provide an electrical path between the first die and the second die. The bridge is coupled to the first die through the first set of vias. The bridge is further coupled to the second die through the second set of vias. Providing the encapsulation portion includes forming an encapsulation layer that at least partially encapsulate the first die, the second die, the bridge, the first set of vias, and the second set of vias. The method forms a redistribution portion on the encapsulation portion. Forming the redistribution portion includes forming a set of redistribution interconnects. Forming the redistribution portion also includes forming at least one dielectric layer.

According to an aspect, the bridge comprises a set of bridge interconnects comprising a bridge interconnect density.

According to one aspect, the bridge interconnect density of the set of bridge interconnects comprises a width of about 2 microns (μm) or less, and/or a spacing of about 2 microns (μm) or less.

According to an aspect, the electrical path between the first die and the second die comprises the set of bridge interconnects in the bridge, the first set of vias and the second set of vias.

According to one aspect, the set of bridge interconnects comprises one of at least a trace, a via, and/or a pad.

According to an aspect, the first die comprises a third set of vias coupled to the set of redistribution interconnects, and the second die comprises a fourth set of vias coupled to the set of redistribution interconnects.

According to one aspect, the third set of vias and the fourth set of vias comprises a via density that is greater than a bridge interconnect density of the bridge.

According to an aspect, the encapsulation layer includes a photosensitive material.

According to one aspect, the integrated device package is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

Figure 1:
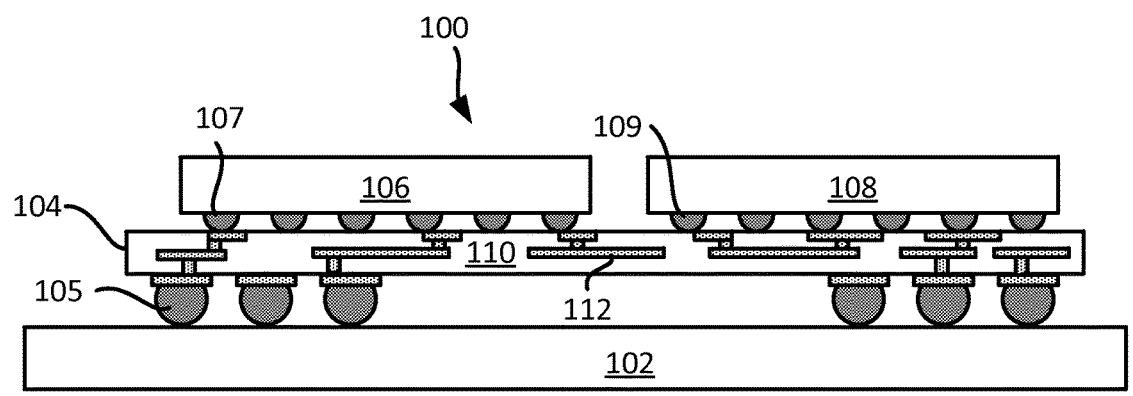
FIG. 1 illustrates a conventional integrated device package comprising two dies.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device package that includes an encapsulation portion and a redistribution portion. The encapsulation portion includes a first die, a first set of vias coupled to the first die, a second die, a second set of vias coupled to the second die, a bridge, and an encapsulation layer. The bridge is configured to provide an electrical path between the first die and the second die. The bridge is coupled to the first die through the first set of vias. The bridge is further coupled to the second die through the second set of vias. The encapsulation layer at least partially encapsulates the first die, the second die, the bridge, the first set of vias, and the second set of vias. The redistribution portion is coupled to the encapsulation portion. The redistribution portion includes a set of redistribution interconnects, and at least one dielectric layer. In some implementations, the bridge includes a set of bridge interconnects comprising a bridge interconnect density. In some implementations, the bridge interconnect density of the set of bridge interconnects comprises a width of about 2 microns (μm) or less, and/or a spacing of about 2 microns (μm) or less.

In some implementation, an interconnect is an element or component of a device (e.g., integrated device, integrated device package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

In some implementations, a redistribution layer (RDL or a redistribution metal layer) is a metal layer of a redistribution portion of an integrated device and/or integrated device package. A redistribution layer may include one or more redistribution interconnects, which are formed on the same metal layer of the redistribution portion. A redistribution portion of an integrated device and/or integrated device package may include several redistribution layers, each redistribution layer may include one or more redistribution interconnects. Thus, for example, a redistribution portion may include a first redistribution interconnect on a first redistribution layer, and a second redistribution interconnect on a second redistribution layer that is different than the first redistribution layer.

Figure 2:
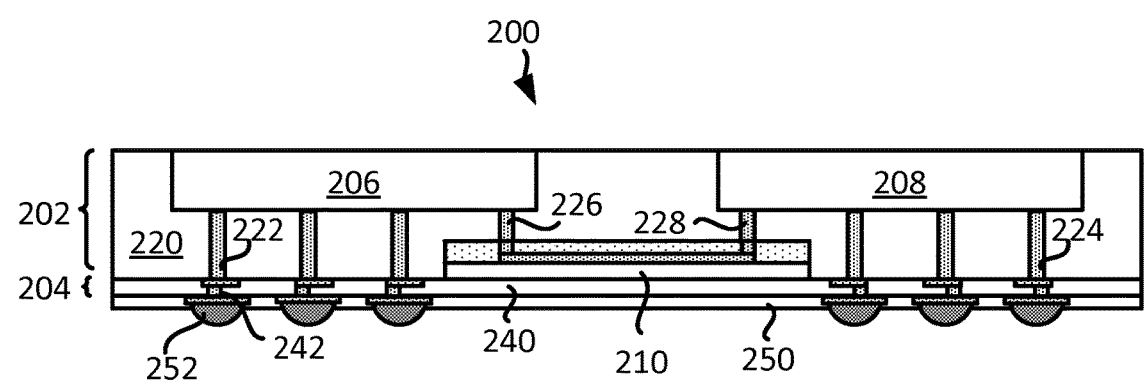
FIG. 2 illustrates an example of an integrated device package comprising a high density interconnect silicon bridge in an encapsulation layer.

Exemplary Integrated Device Package Comprising Silicon Bridge in Encapsulation Layer FIG. 2 illustrates an example of an integrated device package that includes high density die-to-die interconnects. Specifically, FIG. 2 illustrates an example of an integrated device package 200 that includes an encapsulation portion 202, a redistribution portion 204, a first die 206, a second die 208, and a bridge 210. The integrated device package 200 may be a wafer level integrated device package. The bridge 210 may be a silicon bridge. The bridge 210 is configured to provide high density die-to-die interconnects in the integrated device package 200. High density interconnects may refer to any density of wiring or connections per unit area than conventional printed circuit boards and may comprise finer lines and pitch, smaller vias and capture pads, as well as higher connection pad density. High density interconnects may thus be useful to reduce the size, thickness, weight, etc. of the package and/or device as well as enhancing electrical and thermal performance.

The encapsulation portion 202 includes an encapsulation layer 220, a first set of vias 222, a second set of vias 224, a third set of vias 226, and a fourth set of vias 228. The first set of vias 222 is coupled to the first die 206 and the redistribution portion 204. The second set of vias 224 is coupled to the second die 208 and the redistribution portion 204. The third set of vias 226, comprising of at least one via 226, is coupled to the first die 206 and the bridge 210. The fourth set of vias 228, comprising of at least one via 228, is coupled to the second die 208 and the bridge 210. The encapsulation layer 220 may include a photo-imageable, photo-etchable or photosensitive material. A photosensitive material is a material that is photo etchable. That is, the photo photosensitive material is made of a material that can be etched and/or removed through the exposure of the material to a light source (e.g., ultraviolet (UV) light) through a mask (e.g., photomask).

FIG. 2 illustrates that the bridge 210 is at least partially embedded in the encapsulation layer 220 of the encapsulation portion 202. The bridge 210 is configured to provide high density interconnects in the encapsulation portion 202. The bridge 210 may include a substrate (e.g., silicon substrate), a set of interconnects (e.g., set of high density interconnects), and a dielectric layer. The set of interconnects in the bridge 210 includes a bridge interconnect density. In some implementations, the set of interconnects in the bridge 210 has a higher density than at least some of the density of the sets of vias (e.g., sets of vias 222, 224) in the encapsulation layer 220. The density of a set of interconnects (e.g., at least one via) may refer to the width and/or spacing of the set of interconnects, which will be further described in FIGS. 3-4. An example of a bridge (e.g., silicon bridge) is also further described in detail in at least FIGS. 3-4.

The redistribution portion 204 includes a set of dielectric layers (e.g., first dielectric layer 240, second dielectric layer 250), and a set of interconnects 242. As shown in FIG. 2, the redistribution portion 204 is coupled to a first surface (e.g., bottom surface) of the encapsulation portion 202. The redistribution portion 204 is formed over a first surface (e.g., bottom surface) of the encapsulation layer 220 and the bridge 210. The set of dielectric layers 240 and 250 may include one or more dielectric layers. The set of interconnects 242 may include traces, vias, pillars, posts, pads and/or under bump metallization (UBM) layers. The set of interconnects 242 is coupled to the first set of vias 222 and the second set of vias 224. A set of solder balls 252 is coupled to the set of interconnects 242. Examples of various redistribution portions are further described below in detail in at least FIGS. 7-10.

FIG. 2 further illustrates that the first die 206 may be electrically coupled to the second die 208. For example, in some implementations, the first die 206 may be electrically coupled to the second die 208 through the third set of vias 226, the bridge 210, and/or the fourth set of vias 228. In some implementations, the third set of vias 226, the bridge 210, and/or the fourth set of vias 228 define a high density electrical path for high density die-to-die connection between the first and second dies 206 and 208.

Exemplary Silicon Bridge Comprising High Density Interconnects

Figure 3:
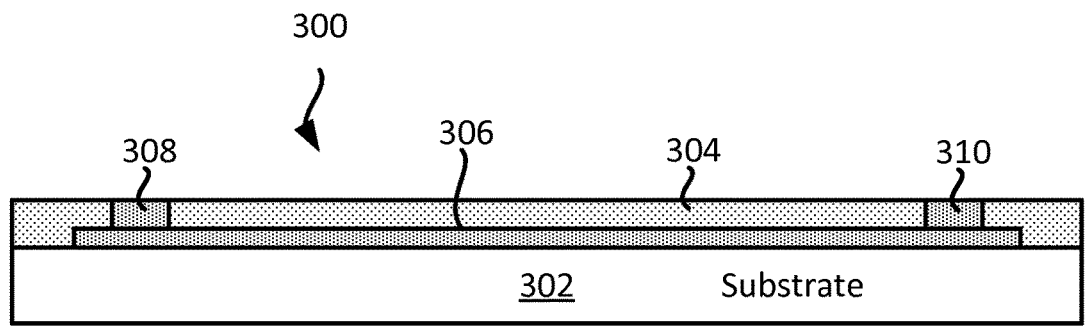
FIG. 3 illustrates an example of a profile view of a high density interconnect silicon bridge.
Figure 4:
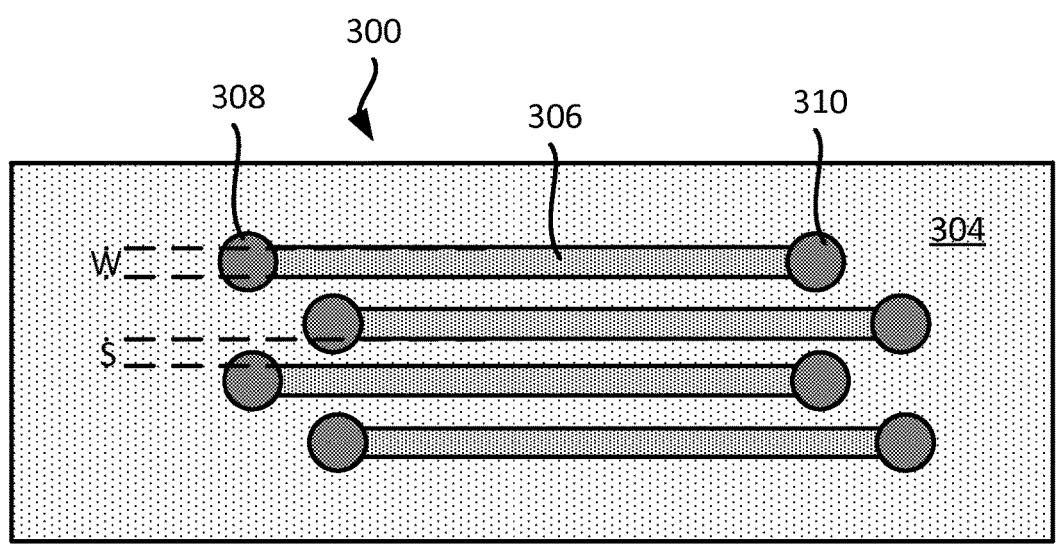
FIG. 4 illustrates an example of a plan view of a high density silicon interconnect bridge.

As mentioned above, an integrated device may include a bridge (e.g., silicon bridge) that is configured to provide high density die-to-die interconnects. FIGS. 3 and 4 illustrate conceptual examples of such bridges configured to provide high density interconnects in an integrated device package.

FIG. 3 illustrates a profile view of an example of a bridge 300 (e.g., silicon bridge) that includes a substrate 302, a dielectric layer 304, a first interconnect 306, a second interconnect 308, and a third interconnect 310. In some implementations, the bridge 300 may be implemented in any of the integrated device package illustrated and described in the present disclosure. For example, the bridge 300 may be the bridge 210 of FIG. 2. In some implementations, the bridge 300 is a bridge means configured to provide a high density die-to-die electrical path or high density die-to-die electrical connection between a first die and a second die.

In some implementations, the substrate 302 is a silicon substrate and/or a wafer. The first interconnect 306 may be a trace located on the substrate 302. The dielectric layer 304 covers the first interconnect 306 and the substrate 302. In some implementations, the second and third interconnects 308 and 310 are vias that vertically traverses the dielectric layer 304. The second and third interconnects 308 and 310 are coupled to the first interconnect 306.

The first, second, and third interconnects 306, 308 and 310 have a bridge interconnect density. In some implementations, the first, second, and third interconnects 306, 308 and 310 are high density interconnects (e.g., high density bridge interconnects). In some implementations, high density interconnects are interconnects that have a width of about 2 microns (μm) or less, and/or a spacing of about 2 microns (μm) or less. In some implementations, the width of an interconnect may be the width of the trace and/or line. In some implementations, the width of an interconnect may be the diameter of a via and/or a pad. A spacing is an edge to edge distance between two neighboring/adjacent interconnects (e.g., two neighboring, adjacent traces).

FIG. 4 illustrates a plan view (e.g., top view) of an example of the bridge 300 (e.g., silicon bridge) that includes a substrate (not visible), the dielectric layer 304, the first interconnect 306, the second interconnect 308, and the third interconnect 310. FIG. 4 illustrates the width and spacing of interconnects. The width of an interconnect is illustrated by (W), and the spacing between two neighboring/adjacent interconnects is illustrated by (S). In some implementations, the first, second, and third interconnects 306, 308, and 310 are high density interconnects. In some implementations, high density interconnects are interconnects that have a width of about 2 microns (μm) or less, and/or a spacing of about 2 microns (μm) or less.

Exemplary Die

Figure 5:
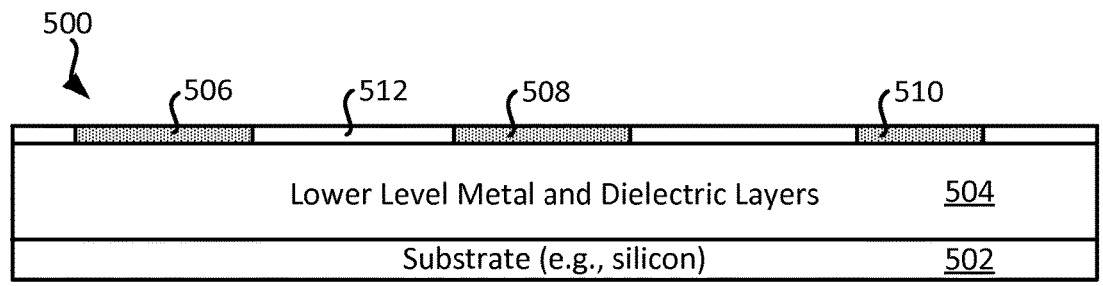
FIG. 5 illustrates an example of a profile view of a die.

FIG. 5 conceptually illustrates an example of a die 500 (which is a form of an integrated circuit device). For purpose of clarity, FIG. 5 illustrates a generalization of a die. As such, not all the components of a die are shown in FIG. 5. The die 500 may be a bare die. In some implementations, the die 500 may correspond to at least one of the dies 206, and/or 208 of FIG. 2, or any other dies described in the present disclosure. As shown in FIG. 5, the die 500 (e.g., integrated circuit device) includes a substrate 502, several lower level metal layers and dielectric layers 504, a first interconnect 506 (e.g., Al, Cu), a second interconnect 508, a third interconnect 510, and a passivation layer 512

In some implementations, the substrate 502 is a silicon substrate. The lower level metal and dielectric layers 504 include lower level metal layers (e.g., M1 metal layer, M2 metal layer, M3 metal layer, M4 metal layer, M5 metal layer, M6 metal layer, M7 metal layer). The lower metal layers of the lower level metal and dielectric layers 504 include traces and/or vias. The lower level metal and dielectric layers 504 also include one or more dielectric layers. In some implementations, the lower level metal and dielectric layers 504 are provided and/or formed using a back end of line (BEOL) process.

The die 500 includes a front side region (e.g.,active region) and a back side region. In some implementations, the front side of the die 500 is the side of die 500 that includes the interconnects 506, 508, and 510. In some implementations, the back side of the die 500 is the side of the die 500 that includes the substrate 502. In some implementations, the die 500 is wafer level die. In some implementations, the die 500 may also include a passivation layer, a first insulation layer, a first under bump metallization (UBM) layer, and a second under bump metallization (UBM) layer.

Figure 6:
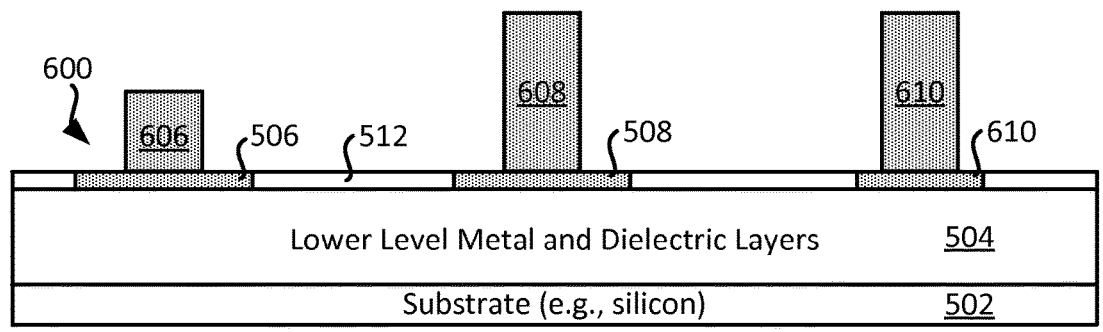
FIG. 6 illustrates another example of a profile view of a die.

FIG. 6 conceptually illustrates another example of a die 600 (which is a form of an integrated circuit device). The die 600 is similar to the die 500 of FIG. 5, except that the die 600 includes a first pillar 606, a second pillar 608, and a third pillar 610. The first pillar 606 is coupled to the first interconnect 506. The second pillar 608 is coupled to the second interconnect 508. The third pillar 610 is coupled to the third interconnect 510.

Figure 7:
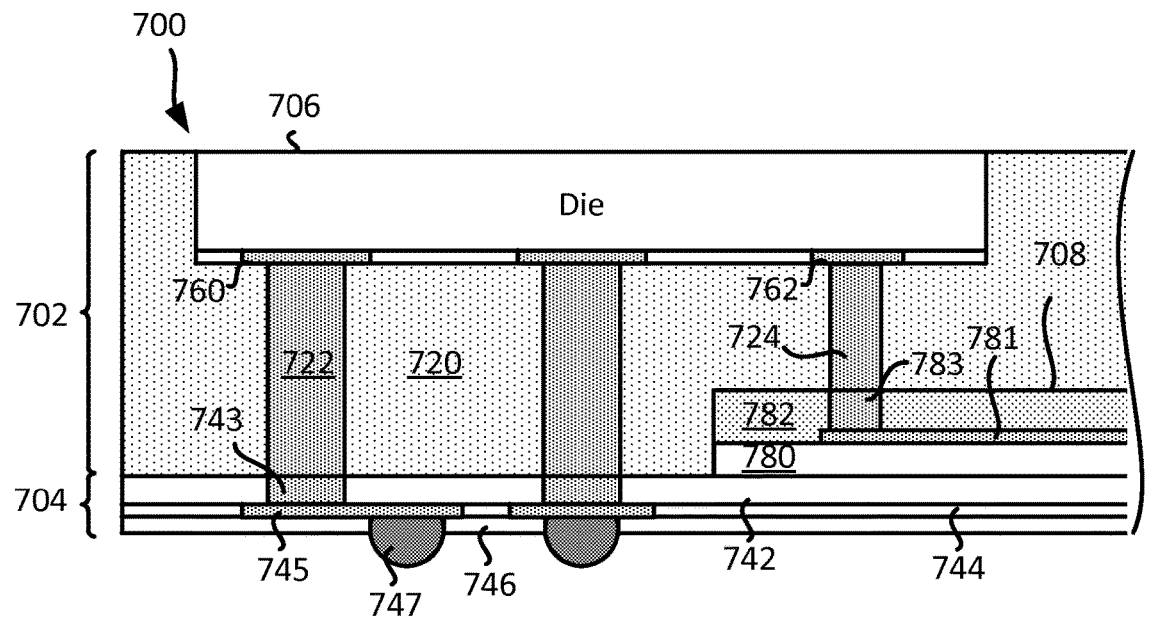
FIG. 7 illustrates an example of a profile view of an integrated device package comprising a high density interconnect silicon bridge in an encapsulation layer.

Exemplary Integrated Device Package Comprising Silicon Bridge in Encapsulation Layer Having described an example of an integrated device package that includes high density die-to-die interconnects in general detail, an example of an integrated device package that includes high density die-to-die interconnects will now be described in more detail. FIG. 7 illustrates an example of a portion of integrated device package 700. In some implementations, the integrated device package 700 may correspond to the integrated device package 200 of FIG. 2. In some implementations, the integrated device package 700 may be a wafer level integrated device package.

The integrated device package 700 includes an encapsulation portion 702, a redistribution portion 704, a first die 706, and a bridge 708. The first die 706 may be similar to the die 500 of FIG. 5. In some implementations, the bridge 708 may correspond to the bridge 300 of FIG. 3. The bridge 708 may be a silicon bridge. The bridge 708 is configured to provide high density die-to-die interconnects in the integrated device package 700. For example, the bridge 708 may be configured to provide high density die-to-die interconnects between the first die 706 and another die (not shown) in the integrated device package 700. The other die (e.g., second die), which is not shown, may be coupled to the bridge 708 in a manner that is similar to how the first die 706 is coupled to the bridge 708.

The encapsulation portion 702 includes an encapsulation layer 720, a first via 722, and a second via 724. The first die 706 and the bridge 708 are located at least partially within the encapsulation portion 702 (e.g., at least partially within the encapsulation layer 720). The first die 706 includes at least a first interconnect 760 (e.g., first pad) and a second interconnect 762 (e.g., second pad). The encapsulation layer 720 may include a photo-etchable or photosensitive material.

The bridge 708 (e.g., silicon bridge) includes a substrate 780, a dielectric layer 782, a first interconnect 781, and a second interconnect 783. In some implementations, the bridge 708 is a bridge means configured to provide a high density die-to-die electrical path or high density die-to-die electrical connection between a first die and a second die in an integrated device package. In some implementations, the substrate 780 is a silicon substrate. The first interconnect 781 may be a trace located on the substrate 780. The dielectric layer 782 covers the first interconnect 781 and the substrate 780. In some implementations, the second interconnect 783 is a via that vertically traverses the dielectric layer 782. The second interconnect 783 is coupled to the first interconnect 781.

In some implementations, the first and second interconnects 781 and 783, are high density interconnects. In some implementations, high density interconnects are interconnects that have a width of about 2 microns (μm) or less, and/or a spacing of about 2 microns (μm) or less. In some implementations, the width of an interconnect may be the width of the trace and/or line. In some implementations, the width of an interconnect may be the diameter of a via and/or a pad. A spacing is an edge to edge distance between two neighboring/adjacent interconnects.

The first via 722 is coupled to the first die 706 and the redistribution portion 704. Specifically, the first via 722 is coupled to (i) the first interconnect 760 (e.g., pad) of the first die 706, and (ii) a first redistribution interconnect 743 of the redistribution portion 704. The second via 724 is coupled to the first die 706 and the bridge 708. Specifically, the second via 724 is coupled to (i) the second interconnect 762 (e.g., pad) of the first die 706, and (ii) the interconnect 783 of the bridge 708. The bridge 708 is coupled to another die (not shown) in the integrated device package 700. The other die (e.g., second die), which is not shown, may be coupled to the bridge 708 in a manner that is similar to how the first die 706 is coupled to the bridge 708.

The redistribution portion 704 includes a first dielectric layer 742, a second dielectric layer 744, a third dielectric layer 746, a first redistribution interconnect 743, and a second redistribution interconnect 745. The first redistribution interconnect 743 is coupled to the first via 722. The second redistribution interconnect 745 is coupled to the first redistribution interconnect 743. A solder ball 747 is coupled to the second redistribution interconnect 745. FIG. 7 illustrates that the second interconnect 745 has a relatively flat or straight shape.

As shown in FIG. 7, the redistribution portion 704 is coupled to the first surface (e.g., bottom surface) of the encapsulation portion 702. The redistribution portion 704 is formed over a first surface (e.g., bottom surface) of the encapsulation layer 720 and the bridge 708. The first and second dielectric layers 742 and 744 may include one or more dielectric layers. The first redistribution interconnect 743 may be a via. The second redistribution interconnect 745 may be a trace and/or pad.

Figure 8:
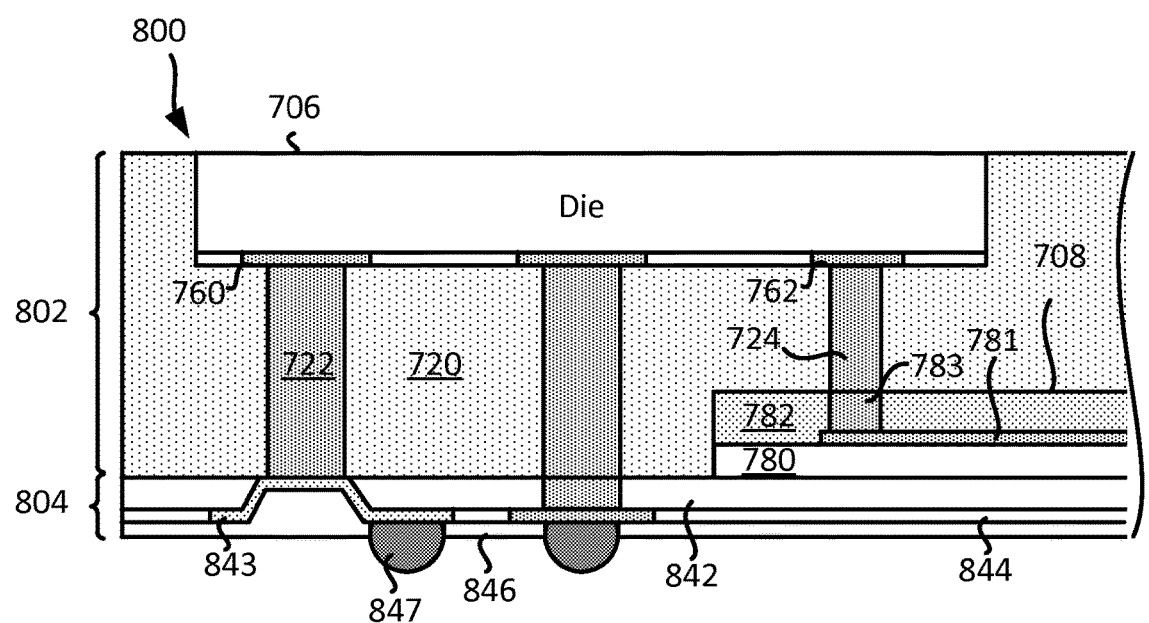
FIG. 8 illustrates another example of a profile view of an integrated device package comprising a high density interconnect silicon bridge in an encapsulation layer.

Exemplary Integrated Device Package Comprising Silicon Bridge in Encapsulation Layer FIG. 8 illustrates another example of a portion of integrated device package 800. In some implementations, the integrated device package 800 may correspond to the integrated device package 200 of FIG. 2. In some implementations, the integrated device package 800 may be a wafer level integrated device package.

The integrated device package 800 includes an encapsulation portion 802, a redistribution portion 804, the first die 706, and the bridge 708. The first die 706 may be similar to the die 500 of FIG. 5. In some implementations, the bridge 708 may correspond to the bridge 300 of FIG. 3. The bridge 708 may be a silicon bridge. The bridge 708 is configured to provide high density die-to-die interconnects in the integrated device package 800. For example, the bridge 708 may be configured to provide high density die-to-die interconnects between the first die 706 and another die (not shown) in the integrated device package 800. The other die (e.g., second die), which is not shown, may be coupled to the bridge 708 in a manner that is similar to how the first die 706 is coupled to the bridge 708.

The encapsulation portion 802 includes the encapsulation layer 720, the first via 722, and the second via 724. The first die 706 and the bridge 708 are located at least partially within the encapsulation portion 802 (e.g., at least partially within the encapsulation layer 720). The first die 706 includes at least a first interconnect 760 (e.g., first pad) and a second interconnect 762 (e.g., second pad). The encapsulation layer 720 may include a photo-etchable or photosensitive material.

The bridge 708 (e.g., silicon bridge) includes the substrate 780, the dielectric layer 782, the first interconnect 781, and the second interconnect 783. In some implementations, the bridge 708 is a bridge means configured to provide a high density die-to-die electrical path or high density die-to-die electrical connection between a first die and a second die in an integrated device package. In some implementations, the substrate 780 is a silicon substrate. In some implementations, the first and second interconnects 781 and 783, are high density interconnects. In some implementations, high density interconnects are interconnects that have a width of about 2 microns (µm) or less, and/or a spacing of about 2 microns (µm) or less.

The first via 722 is coupled to the first die 706 and the redistribution portion 804. Specifically, the first via 722 is coupled to (i) the first interconnect 760 of the first die 706, and (ii) the first redistribution interconnect 843 of the redistribution portion 804. The second via 724 is coupled to the first die 706 and the bridge 708. Specifically, the second via 724 is coupled to (i) the second interconnect 762 of the first die 706, and (ii) the interconnect 783 of the bridge 708. The bridge 708 is coupled to another die (not shown) in the integrated device package 800. The other die (e.g., second die 208), which is not shown, may be coupled to the bridge 708 in a manner that is similar to how the first die 706 is coupled to the bridge 708.

The redistribution portion 804 includes a first dielectric layer 842, a second dielectric layer 844, a third dielectric layer 846, and a first redistribution interconnect 843. The first redistribution interconnect 843 may have a shape that is at least partially U or V shaped. The first redistribution interconnect 843 is coupled to the first via 722. A solder ball 847 is coupled to the first redistribution interconnect 843.

As shown in FIG. 8, the redistribution portion 804 is coupled to the first surface (e.g., bottom surface) of the encapsulation portion 802. The redistribution portion 804 is formed over a first surface (e.g., bottom surface) of the encapsulation layer 720 and the bridge 708. The first, second, and third dielectric layers 842, 844, and 846 may include one or more dielectric layers.

It should be noted that in some implementations, the redistribution portion 804 may include combinations of the first redistribution interconnect 843, the first redistribution interconnect 743, and/or the second redistribution interconnect 745.

Figure 9:
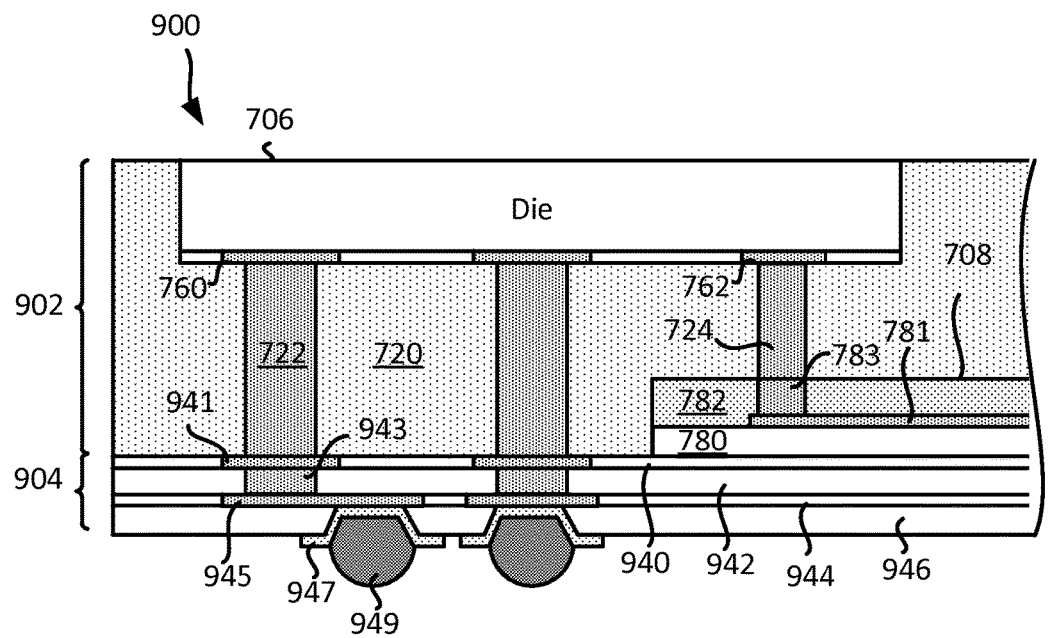
FIG. 9 illustrates an example of a profile view of an integrated device package comprising a high density silicon interconnect bridge in an encapsulation layer.

Exemplary Integrated Device Package Comprising Silicon Bridge in Encapsulation Layer FIG. 9 illustrates another example of a portion of integrated device package 900. In some implementations, the integrated device package 900 may correspond to the integrated device package 200 of FIG. 2. In some implementations, the integrated device package 900 may be a wafer level integrated device package.

The integrated device package 900 includes an encapsulation portion 902, a redistribution portion 904, the first die 706, and the bridge 708. The first die 706 may be similar to the die 500 of FIG. 5. In some implementations, the bridge 708 may correspond to the bridge 300 of FIG. 3. The bridge 708 may be a silicon bridge. The bridge 708 is configured to provide high density die-to-die interconnects in the integrated device package 900. For example, the bridge 708 may be configured to provide high density die-to-die interconnects between the first die 706 and another die (not shown) in the integrated device package 900. The other die (e.g., second die 208), which is not shown, may be coupled to the bridge 708 in a manner that is similar to how the first die 706 is coupled to the bridge 708.

The encapsulation portion 902 includes the encapsulation layer 720, the first via 722, and the second via 724. The first die 706 and the bridge 708 are located at least partially within the encapsulation portion 902 (e.g., at least partially within the encapsulation layer 720). The first die 706 includes at least a first interconnect 760 (e.g., first pad) and a second interconnect 762 (e.g., second pad). The encapsulation layer 720 may include a photo-etchable or photosensitive material.

The bridge 708 (e.g., silicon bridge) includes the substrate 780, the dielectric layer 782, the first interconnect 781, and the second interconnect 783. In some implementations, the bridge 708 is a bridge means configured to provide a high density die-to-die electrical path or high density die-to-die electrical connection between a first die and a second die in an integrated device package. In some implementations, the substrate 780 is a silicon substrate. In some implementations, the first and second interconnects 781 and 783, are high density interconnects. In some implementations, high density interconnects are interconnects that have a width of about 2 microns (μm) or less, and/or a spacing of about 2 microns (μm) or less.

The first via 722 is coupled to the first die 706 and the redistribution portion 904. Specifically, the first via 722 is coupled to (i) the first interconnect 760 of the first die 706, and (ii) the first redistribution interconnect 941 of the redistribution portion 904. The second via 724 is coupled to the first die 706 and the bridge 708. Specifically, the second via 724 is coupled to (i) the second interconnect 762 of the first die 706, and (ii) the interconnect 783 of the bridge 708. The bridge 708 is coupled to another die (not shown) in the integrated device package 900. The other die (e.g., second die 208), which is not shown, may be coupled to the bridge 708 in a manner that is similar to how the first die 706 is coupled to the bridge 708.

The redistribution portion 904 includes a first dielectric layer 940, a second dielectric layer 942, a third dielectric layer 944, a fourth dielectric layer 946, a first redistribution interconnect 941, a second redistribution interconnect 943, a third redistribution interconnect 945, and an under bump metallization (UBM) layer 947. The first redistribution interconnect 941 is coupled to the first via 722. The first redistribution interconnect 941 may be a pad or trace. The second redistribution interconnect 943 is coupled to the first redistribution interconnect 941. The second redistribution interconnect 943 may be a via. The third redistribution interconnect 945 is coupled to the second redistribution interconnect 943. The third redistribution interconnect 945 may be a pad or trace. The UBM layer 947 is coupled to the third redistribution interconnect 945. A solder ball 949 is coupled to the UBM layer 947.

As shown in FIG. 9, the redistribution portion 904 is coupled to the first surface (e.g., bottom surface) of the encapsulation portion 902. The redistribution portion 904 is formed over a first surface (e.g., bottom surface) of the encapsulation layer 720 and the bridge 708. The first, second, third and fourth dielectric layers 940, 942, 944, and 946 may include one or more dielectric layers.

Figure 10:
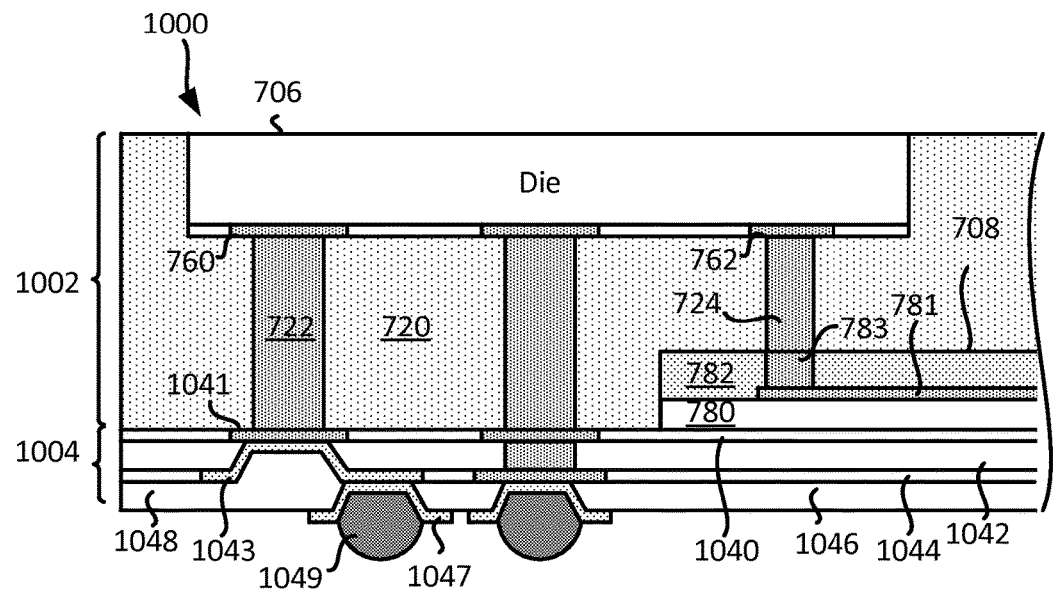
FIG. 10 illustrates an example of a profile view of an integrated device package comprising a high density interconnect silicon bridge in an encapsulation layer.

Exemplary Integrated Device Package Comprising Silicon Bridge in Encapsulation Layer FIG. 10 illustrates another example of a portion of integrated device package 1000. In some implementations, the integrated device package 1000 may correspond to the integrated device package 200 of FIG. 2. In some implementations, the integrated device package 1000 may be a wafer level integrated device package.

The integrated device package 1000 includes an encapsulation portion 1002, a redistribution portion 1004, the first die 706, and the bridge 708. The first die 706 may be similar to the die 500 of FIG. 5. In some implementations, the bridge 708 may correspond to the bridge 300 of FIG. 3. The bridge 708 may be a silicon bridge. The bridge 708 is configured to provide high density die-to-die interconnects in the integrated device package 1000. For example, the bridge 708 may be configured to provide high density die-to-die interconnects between the first die 706 and another die (not shown) in the integrated device package 1000. The other die (e.g., second die 208), which is not shown, may be coupled to the bridge 708 in a manner that is similar to how the first die 706 is coupled to the bridge 708.

The encapsulation portion 1002 includes the encapsulation layer 720, the first via 722, and the second via 724. The first die 706 and the bridge 708 are located at least partially within the encapsulation portion 1002 (e.g., at least partially within the encapsulation layer 720). The first die 706 includes at least a first interconnect 760 (e.g., first pad) and a second interconnect 762 (e.g., second pad). The encapsulation layer 720 may include a photo-etchable or photosensitive material.

The bridge 708 (e.g., silicon bridge) includes the substrate 780, the dielectric layer 782, the first interconnect 781, and the second interconnect 783. In some implementations, the bridge 708 is a bridge means configured to provide a high density die-to-die electrical path or high density die-to-die electrical connection between a first die and a second die in an integrated device package. In some implementations, the substrate 780 is a silicon substrate. In some implementations, the first and second interconnects 781 and 783, are high density interconnects. In some implementations, high density interconnects are interconnects that have a width of about 2 microns (μm) or less, and/or a spacing of about 2 microns (μm) or less.

The first via 722 is coupled to the first die 706 and the redistribution portion 1004. Specifically, the first via 722 is coupled to (i) the first interconnect 760 of the first die 706, and (ii) the first redistribution interconnect 1041 of the redistribution portion 1004. The second via 724 is coupled to the first die 706 and the bridge 708. Specifically, the second via 724 is coupled to (i) the second interconnect 762 of the first die 706, and (ii) the interconnect 783 of the bridge 708. The bridge 708 is coupled to another die (not shown) in the integrated device package 1000. The other die (e.g., second die 208), which is not shown, may be coupled to the bridge 708 in a manner that is similar to how the first die 706 is coupled to the bridge 708.

The redistribution portion 1004 includes a first dielectric layer 1040, a second dielectric layer 1042, a third dielectric layer 1044, a fourth dielectric layer 1046, a first redistribution interconnect 1041, a second redistribution interconnect 1043, and an under bump metallization (UBM) layer 1047. The first redistribution interconnect 1041 is coupled to the first via 722. The first redistribution interconnect 1041 may be a pad or trace. The second redistribution interconnect 1043 is coupled to the first redistribution interconnect 1041. The second redistribution interconnect 1043 may have a shape that is at least partially U or V shaped. The UBM layer 1047 is coupled to the second redistribution interconnect 1043. A solder ball 1049 is coupled to the UBM layer 1047.

As shown in FIG. 10, the redistribution portion 1004 is coupled to the first surface (e.g., bottom surface) of the encapsulation portion 1002. The redistribution portion 1004 is formed over a first surface (e.g., bottom surface) of the encapsulation layer 720 and the bridge 708. The first, second, third and fourth dielectric layers 1040, 1042, 1044, and 1046 may include one or more dielectric layers.

It should be noted that in some implementations, the redistribution portion 1004 may include combinations of the second redistribution interconnect 1043, the redistribution interconnect 943, and/or the redistribution interconnect 945.

Figure 11:
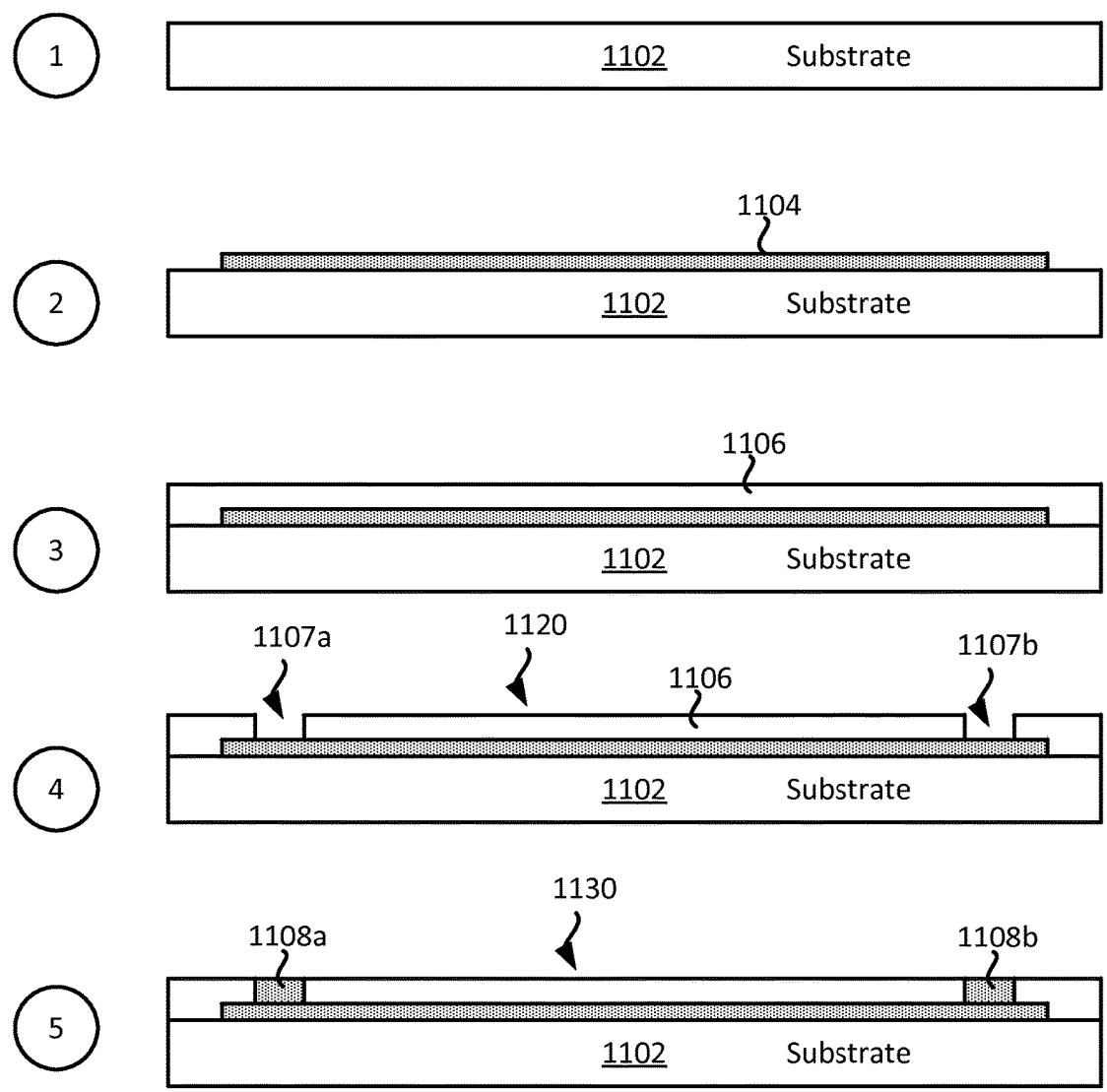
FIG. 11 illustrates an exemplary sequence for providing/fabricating a high density interconnect silicon bridge.

Exemplary Sequence for Providing/Fabricating a High Density Interconnect Silicon Bridge In some implementations, providing/fabricating a high density interconnect silicon bridge includes several processes. FIG. 11 illustrates an exemplary sequence for providing/fabricating a high density interconnect silicon bridge. In some implementations, the sequence of FIG. 11 may be used to provide/fabricate the bridge of FIGS. 2-4, 7-10 and/or other bridges described in the present disclosure. However, for the purpose of simplification, FIG. 11 will be described in the context of providing/fabricating the bridge of FIG. 3.

It should be noted that the sequence of FIG. 11 may combine one or more stages in order to simplify and/or clarify the sequence for providing/fabricating a bridge. In some implementations, the order of the processes may be changed or modified.

Stage 1 of FIG. 11, illustrates a state after a substrate 1102 is provided. In some implementations, the substrate 1102 is provided by a supplier. In some implementations, the substrate 1102 is fabricated (e.g., formed). In some implementations, the substrate 1102 is one of at least a silicon substrate and/or wafer (e.g., silicon wafer).

Stage 2 illustrates a state after a metal layer 1104 is formed on the substrate 1102. In some implementations, the metal layer 1104 may form and/or define one or more high density interconnects (e.g., as described in FIGS. 3-4). In some implementations, providing the metal layer 1104 includes forming (e.g., plating) one or more metal layers (e.g., seed layer and metal layer) and selectively etching portions of the one or more metal layers. FIGS. 15-18 illustrate examples of providing one or more metal layers using several plating processes.

Stage 3 illustrates a state after a dielectric layer 1106 is formed over the substrate 1102 and the metal layer 1104. Different implementations may use different materials for the dielectric layer 1106.

Stage 4 illustrates a state after cavities 1107 (e.g., cavity 1107a, cavity 1107b) are formed in the dielectric layer 1106. Different implementations may use different processes for forming cavities in the dielectric layer 1106. In some implementations, a laser may be used to form the cavities. In some implementations, a photo etching process is used to form the cavities. Stage 4 may illustrate a bridge 1120 (e.g., silicon bridge) that may be implemented in an integrated device package.

Stage 5 illustrates a state after vias 1108 (e.g., via 1108a, via 1108b) are formed in the dielectric layer 1106. Specifically, the vias 1108 are formed in the cavities 1107 of the dielectric layer 1106. In some implementations, the vias 1108 are high density vias (e.g., as described in FIGS. 3-4). In some implementations, the vias 1108 are metal layer(s) that are formed using one or more plating processes. FIGS. 15-18 illustrate examples of providing one or more metal layers using several plating processes. In some implementations, stage 5 illustrates a bridge 1130 (e.g., silicon bridge) that may be implemented in an encapsulation layer of any of the integrated device package. It should be noted that in some implementations, the vias 1108 may be formed once the bridge is positioned or embedded in an encapsulation layer of the integrated device package.

Figure 12:
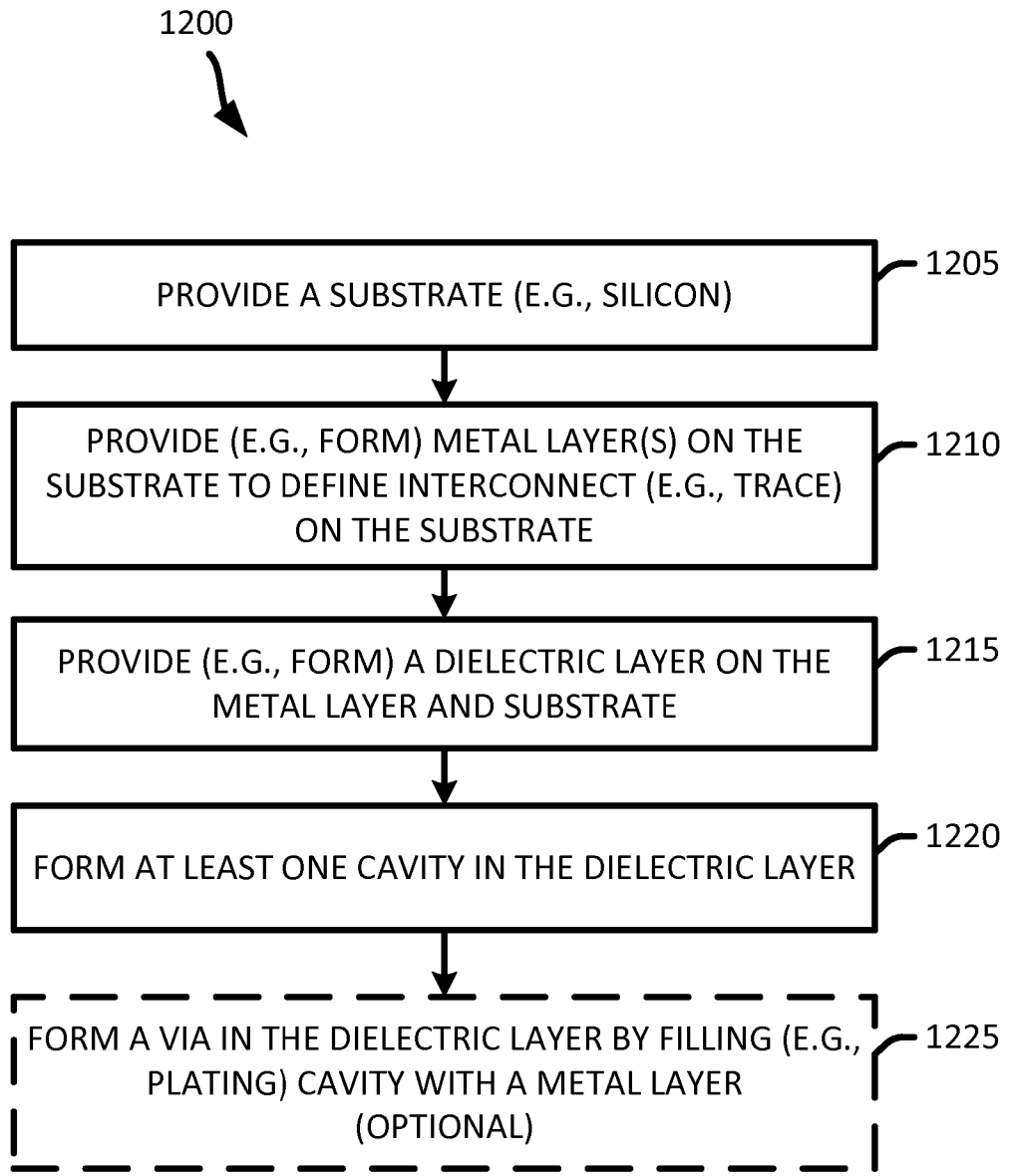
FIG. 12 illustrates an exemplary flow diagram of a method for providing/fabricating a high density interconnect silicon bridge.

Exemplary Flow Diagram of a Method for Providing/Fabricating a High Density Interconnect Silicon Bridge FIG. 12 illustrates an exemplary flow diagram of a method 1200 for providing/fabricating a high density interconnect silicon bridge. In some implementations, the method of FIG. 12 may be used to provide/fabricate the high density interconnect silicon bridge of FIGS. 2-4, 7-10 and/or other high density interconnect silicon bridge in the present disclosure.

It should be noted that the flow diagram of FIG. 12 may combine one or more step and/or processes in order to simplify and/or clarify the method for providing a passive device package. In some implementations, the order of the processes may be changed or modified.

The method provides (at 1205) a substrate. In some implementations, providing the substrate may includes receiving a substrate from a supplier or fabricating (e.g., forming) a substrate. In some implementations, the substrate is one of at least a silicon substrate and/or wafer (e.g., silicon wafer).

The method forms (at 1210) a metal layer on the substrate to form one or more high density interconnect (e.g., as described in FIGS. 3-4). In some implementations, forming the metal layer includes forming (e.g., plating) one or more metal layers (e.g., seed layer and metal layer) and selectively etching portions of the one or more metal layers. FIGS. 15-18 illustrate examples of providing one or more metal layers using several plating processes.

The method forms (at 1215) a dielectric layer over the substrate and the metal layer. Different implementations may use different materials for the dielectric layer.

The method then forms (at 1220) at least one cavity in the dielectric layer. Different implementations may use different processes for forming cavities in the dielectric layer. In some implementations, a laser may be used to form the cavities. In some implementations, a photo etching process is used to form the cavities. In some implementations, once the cavity is formed, a bridge (e.g., bridge 1220) may be defined which may be implemented in an encapsulation layer of any of the integrated device package described in the present disclosure.

The method optionally forms (at 1225) a via in the dielectric layer. Specifically, the method fills the cavity of the dielectric layer with one or more conducting material (e.g., metal layers) to form a via in the cavity. In some implementations, the vias are high density vias (e.g., as described in FIGS. 3-4). In some implementations, the vias are metal layer(s) that are formed using one or more plating processes. FIGS. 15-18 illustrate examples of providing one or more metal layers using several plating processes. It should be noted that in some implementations, the vias may be formed once the bridge is positioned or embedded in an encapsulation layer of the integrated device package.

Exemplary Sequence for Providing/Fabricating an Integrated Device Package that Includes a High Density Interconnect Silicon Bridge in an Encapsulation Layer In some implementations, providing/fabricating an integrated device package that includes a high density interconnect silicon bridge in an encapsulation layer includes several processes. FIG. 13 (which includes FIGS. 13A-13C) illustrates an exemplary sequence for providing/fabricating an integrated device that includes a high density interconnect silicon bridge in an encapsulation layer. In some implementations, the sequence of FIGS. 13A-13C may be used to provide/fabricate the integrated device of FIGS. 2, 7-10 and/or other integrated device package in the present disclosure. However, for the purpose of simplification, FIGS.

13A-13C will be described in the context of providing/fabricating the integrated device of FIG. 2.

Figure 13A:
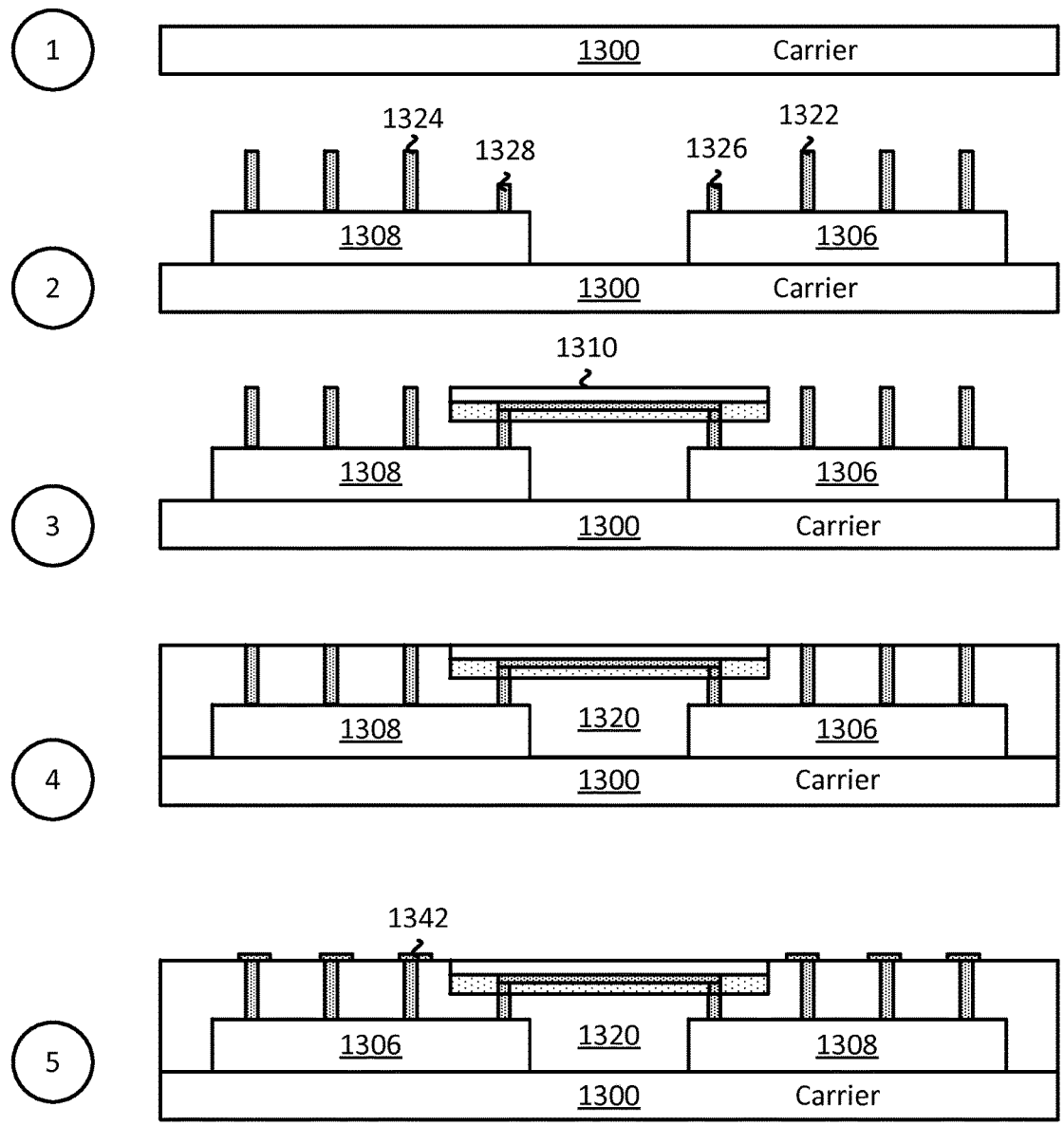
FIG. 13 (comprising FIGS. 13A-13C) illustrates an exemplary sequence for providing/fabricating an integrated device package comprising a high density silicon bridge in an encapsulation layer.
Figure 13B:
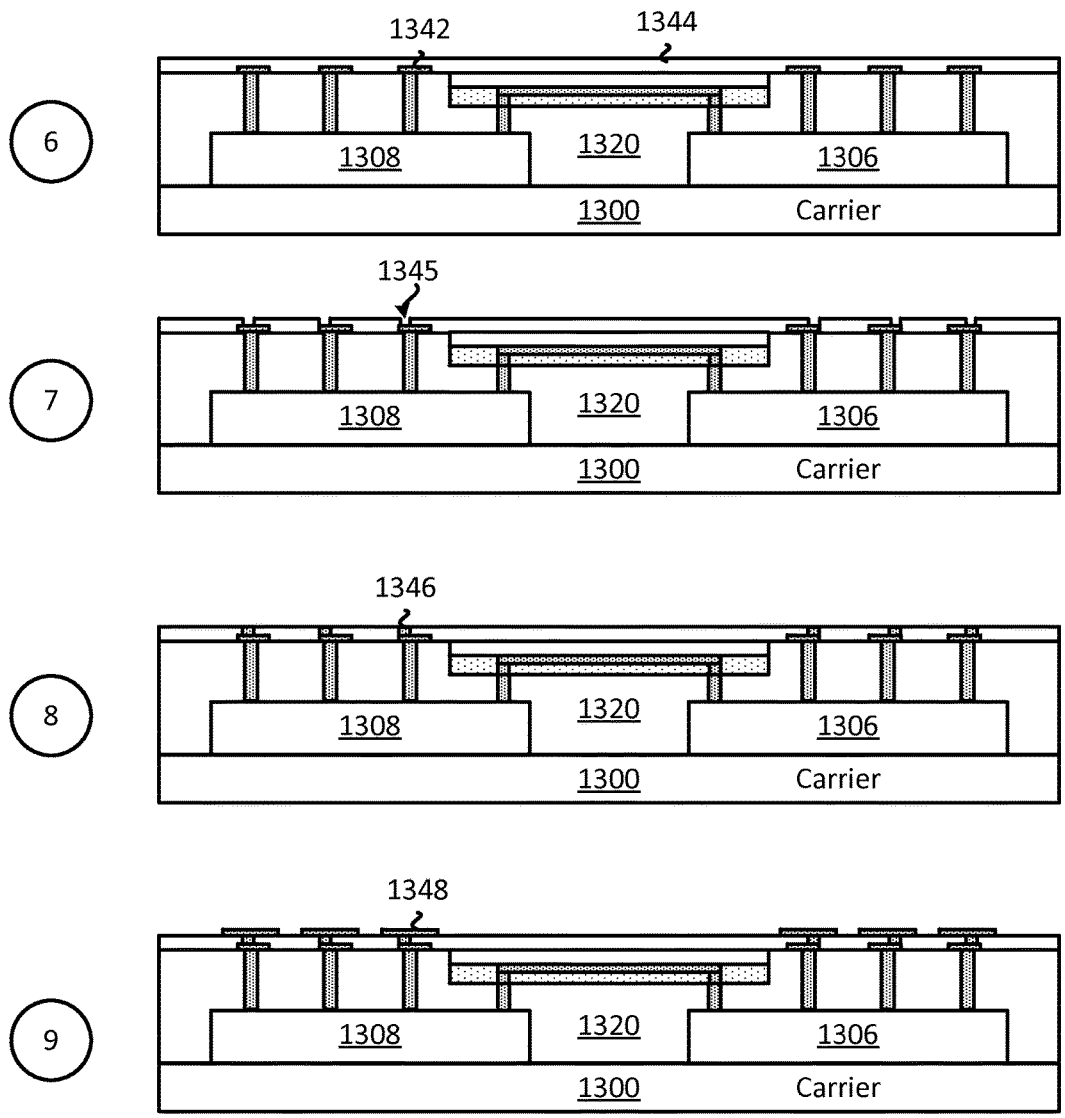
Figure 13C:
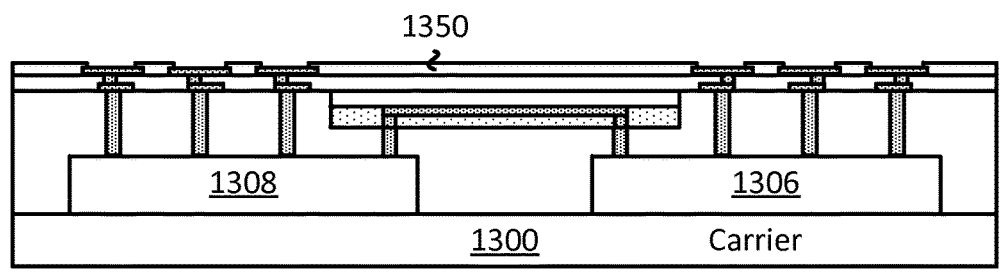
Figure 13C:
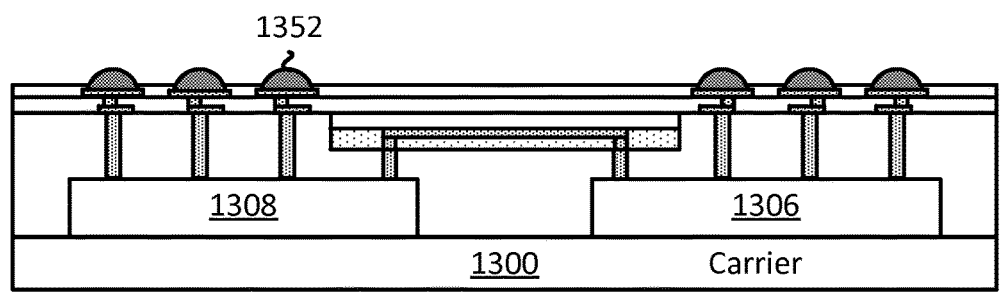
Figure 13C:
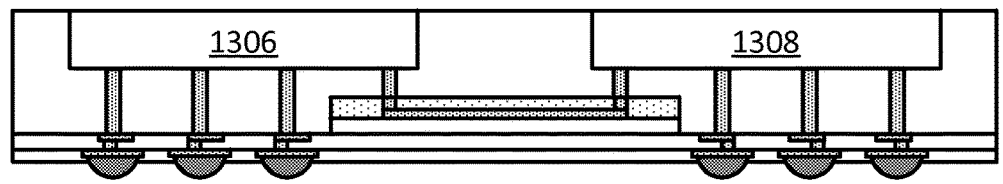

It should be noted that the sequence of FIGS. 13A-13C may combine one or more stages in order to simplify and/or clarify the sequence for providing an integrated device. In some implementations, the order of the processes may be changed or modified.

Stage 1 of FIG. 13A, illustrates a state after a carrier 1300 is provided. In some implementations, the carrier 1300 is provided by a supplier. In some implementations, the carrier 1300 is fabricated (e.g., formed). In some implementations, the carrier 1300 is a silicon substrate and/or wafer (e.g., silicon wafer).

Stage 2 illustrates a state after a first die 1306 and a second die 1308 are provided on the carrier 1300. In some implementations, the first and second dies 1306 and 1308 are similar to the dies 500 or 600 of FIG. 5 or 6. The first die 1306 includes a first via 1322 and a third via 1326. The second die 1308 includes a second via 1324 and a fourth via 1328. As shown in stage 2, the third via 1326 is shorter than the first via 1322. Similarly, the fourth via 1328 is shorter than the second via 1324. The vias 1322, 1324, 1326 and 1328 may be pillars (e.g., copper pillars) coupled to their respective dies 1306 and 1308. The first die 1306 and the second die 1308 are provided on the carrier 1300 such that the backside of the respective dies 1306 and 1308 are mechanically coupled to the carrier 1300.

Stage 3 illustrates a state after a bridge 1310 is coupled to the first and second dies 1306 and 1308. The bridge 1310 may be a silicon bridge. The bridge 1310 may include a substrate, at least one metal layer, at least one via, and/or at least one dielectric layer, as described in FIG. 3. Examples of the bridge 1310 include the bridge 300 shown and described in FIGS. 3-4. In some implementations, the bridge 1310 is a high density interconnect bridge configured to provide a connection and/or electrical path between two dies. As shown at stage 3, the bridge 1310 is coupled to (i) the third via 1326 of the first die 1306, and (ii) the fourth die 1328 of the second die 1308.

Stage 4 illustrates a state after an encapsulation layer 1320 is provided on the carrier 1300, the first die 1306, the second die 1308, and the bridge 1310. As shown in stage 4, the encapsulation layer 1320 at least partially encapsulates the first die 1306, the second die 1308, and the bridge 1310. The encapsulation layer 1320 may includes a photo-etchable or photosensitive material.

Stage 5 illustrates a state after a first metal layer 1342 is formed in the encapsulation layer 1320. In some implementations, the first metal layer 1342 forms a first redistribution layer of a redistribution portion of an integrated device package. The first metal layer 1342 may form one or more redistribution interconnect (e.g., trace, pad). As shown in stage 5, some portions of the first metal layer 1342 is coupled to the vias 1322 and 1324. In some implementations, providing the first metal layer 1342 includes forming (e.g., plating) one or more metal layers (e.g., seed layer and metal layer) and selectively etching portions of the one or more metal layers. FIGS. 15-18 illustrate examples of providing one or more metal layers using several plating processes.

Stage 6, as shown in FIG. 13B, illustrates a state after a first dielectric layer 1344 is formed on the encapsulation layer 1320 and the first metal layer 1342.

Stage 7 illustrates a state after a cavity 1345 is formed in the first dielectric layer 1344. The cavity 1345 is formed over at least a portion of the first metal layer 1342. The cavity 1345 may be formed in the first dielectric layer 1344 by etching (e.g., photo-etching) the first dielectric layer 1344.

Stage 8 illustrates a state after the cavity 1345 is filled with a conductive material to define a via 1346 in the first dielectric layer 1344. Different implementations may fill the cavity 1345 differently. In some implementations, a plating process is used to define the via 1346. In other implementations, a conductive paste may be used to fill the cavity 1345 to define the via 1346. The via 1346 may be a second metal layer (e.g., second redistribution interconnect) of the redistribution portion that is coupled to the first metal layer 1342.

Stage 9 illustrates a state after a third metal layer 1348 is formed on the first dielectric layer 1344. In some implementations, the third metal layer 1342 forms a first redistribution layer of a redistribution portion of an integrated device package. The first metal layer 1342 may form one or more redistribution interconnect (e.g., trace, pad). As shown in stage 9, some portions of the third metal layer 1348 is coupled to the via 1346. In some implementations, providing the third metal layer 1348 includes forming (e.g., plating) one or more metal layers (e.g., seed layer and metal layer) and selectively etching portions of the one or more metal layers. FIGS. 15-18 illustrate examples of providing one or more metal layers using several plating processes.

Stage 10, as shown in FIG. 13C, illustrates a state after a second dielectric layer 1350 is formed on the first dielectric layer 1344 and the third metal layer 1348. In some implementations, the second dielectric layer 1350 is formed such that some of the third metal layer 1348 is exposed.

Stage 11 illustrates a state after a set of solder balls 1352 is provided on the third metal layer 1348.

Stage 12 illustrates a state after the carrier 1300 is removed. Different implementations may remove the carrier 1300 differently. In some implementations, the carrier 1300 is removed through an etching process and/or lift off process.

Figure 14:
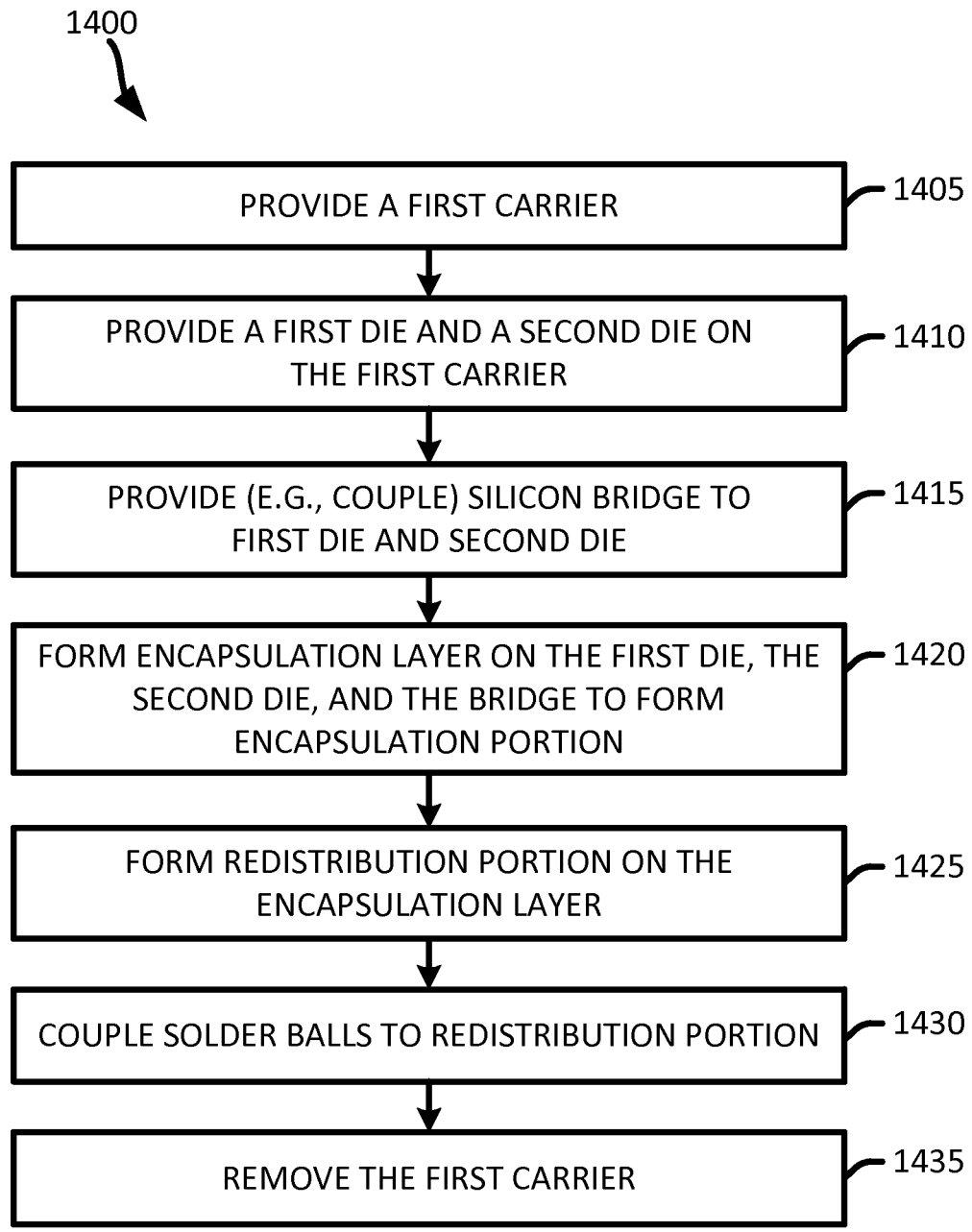
FIG. 14 illustrates an exemplary flow diagram of a method for providing/fabricating an integrated device package comprising a high density silicon bridge in an encapsulation layer.

Exemplary Method for Providing/Fabricating an Integrated Device that Includes a High Density Interconnect Silicon Bridge in an Encapsulation Layer FIG. 14 illustrates an exemplary flow diagram of a method 1400 for providing/fabricating an integrated device package that includes a high density interconnect silicon bridge in an encapsulation layer. In some implementations, the method of FIG. 14 may be used to provide/fabricate the integrated device package of FIG. 2 and/or other integrated device package in the present disclosure.

It should be noted that the flow diagram of FIG. 14 may combine one or more step and/or processes in order to simplify and/or clarify the method for providing an integrated device package. In some implementations, the order of the processes may be changed or modified.

The method provides (at 1405) a carrier. In some implementations, the carrier is provided by a supplier. In some implementations, the carrier is fabricated (e.g., formed). In some implementations, the carrier is a silicon substrate and/or wafer (e.g., silicon wafer).

The method then provides (at 1410) a first die and a second die to the carrier. The first die and the second die are provided on the carrier such that the backside of the respective dies are mechanically coupled to the carrier. In some implementations, the dies are provided on the carrier using a pick and place method. For example, the dies may be provided on a carrier that includes a hydrophobic area and hydrophilic area. The dies may be provides such that they couple to the hydrophilic area(s) of the carrier. One advantage of using hydrophobic areas and hydrophilic areas is that the dies will self-align on the carrier, thereby ensuring the precise and accurate positioning of the dies on the carrier.

The method couples (at 1415) a bridge to the first die and the second die. The bridge may include a substrate, at least one metal layer, at least one via, and/or at least one dielectric layer, as described in FIG. 3. In some implementations, the bridge is a high density interconnect bridge configured to provide a high density connection and/or high density electrical path between two dies.

The method forms (at 1420) an encapsulation layer on the first die, the second die, and the bridge. The encapsulation layer is provided such that it at least partially encapsulates the first die, the second die, and the bridge. The encapsulation layer may includes a photo-etchable or photosensitive material.

The method forms (at 1425) a redistribution portion on the encapsulation layer. In some implementations, forming the redistribution portion includes forming at least one redistribution interconnect and at least one dielectric layer. In some implementations, forming the redistribution portion includes forming an under bump metallization (UBM) layer. Stages 5-10 of FIGS. 13A-13C illustrates an example of providing and/or forming a redistribution portion of an integrated device package.

The method also provides (at 1430) solder balls to the redistribution portion. In some implementations, providing the solder balls includes coupling solder balls to a UBM layer or a redistribution interconnect.

The method then removes (at 1435) the first carrier, leaving the integrated device package that includes the encapsulation portion and the redistribution portion, where the encapsulation portion includes a high density bridge that provides a high density connection between two dies. Different implementations may remove the first carrier differently. In some implementations, the first carrier is decoupled (e.g., lift off process). In some implementations, the first carrier is etched out.

Exemplary Semi-Additive Patterning (SAP) Process

Various interconnects (e.g., traces, vias, pads) are described in the present disclosure. These interconnects may be formed in the bridge, the encapsulation portion and/or the redistribution portion of the integrated device package. In some implementations, these interconnects may includes one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes.

Different implementations may use different processes to form and/or fabricate the metal layers (e.g., interconnects, redistribution layer, under bump metallization layer, protrusion). In some implementations, these processes include a semi-additive patterning (SAP) process and a damascene process. These various different processes are further described below.

Figure 15:
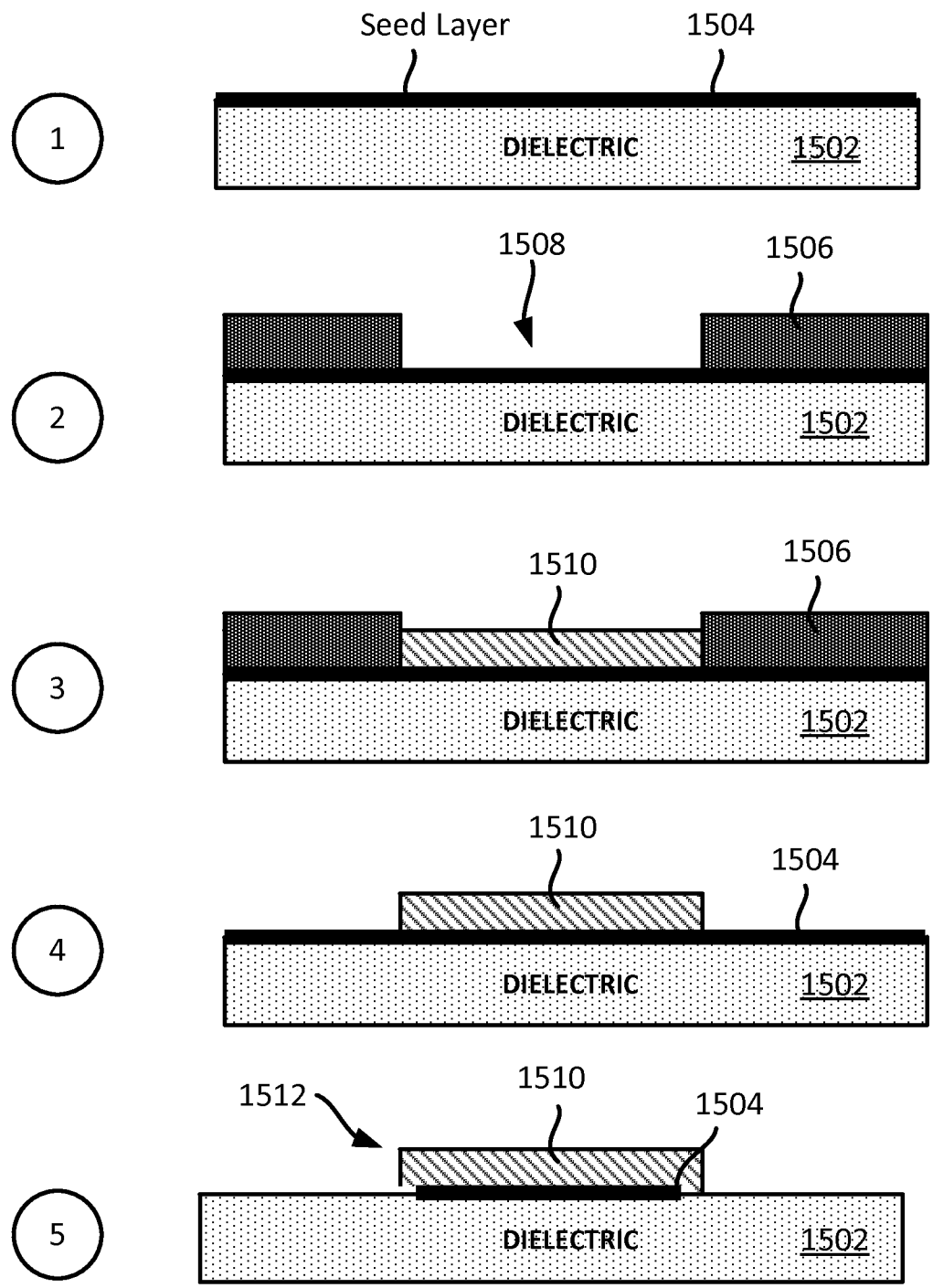
FIG. 15 illustrates an example of a semi-additive patterning (SAP) process.

FIG. 15 illustrates a sequence for forming an interconnect using a semi-additive patterning (SAP) process to provide and/or form an interconnect in one or more dielectric layer(s). As shown in FIG. 15, stage 1 illustrates a state of an integrated device (e.g., substrate) after a dielectric layer 1502 is provided (e.g., formed). In some implementations, stage 1 illustrates that the dielectric layer 1502 includes a first metal layer 1504. The first metal layer 1504 is a seed layer in some implementations. In some implementations, the first metal layer 1504 may be provided (e.g., formed) on the dielectric layer 1502 after the dielectric layer 1502 is provided (e.g., received or formed). Stage 1 illustrates that the first metal layer 1504 is provided (e.g., formed) on a first surface of the dielectric layer 1502. In some implementations, the first metal layer 1504 is provided by using a deposition process (e.g., PVD, CVD, plating process).

Stage 2 illustrates a state of the integrated device after a photo resist layer 1506 (e.g., photo develop resist layer) is selectively provided (e.g., formed) on the first metal layer 1504. In some implementations, selectively providing the resist layer 1506 includes providing the resist layer 1506 on the first metal layer 1504 and selectively removing portions of the resist layer 1506 by developing (e.g., using a development process). Stage 2 illustrates that the resist layer 1506 is provided such that a cavity 1508 is formed.

Stage 3 illustrates a state of the integrated device after a second metal layer 1510 is formed in the cavity 1508. In some implementations, the second metal layer 1510 is formed over an exposed portion of the first metal layer 1504. In some implementations, the second metal layer 1510 is provided by using a deposition process (e.g., plating process).

Stage 4 illustrates a state of the integrated device after the resist layer 1506 is removed. Different implementations may use different processes for removing the resist layer 1506.

Stage 5 illustrates a state of the integrated device after portions of the first metal layer 1504 are selectively removed. In some implementations, one or more portions of the first metal layer 1504 that is not covered by the second metal layer 1510 is removed. As shown in stage 5, the remaining first metal layer 1504 and the second metal layer 1510 may form and/or define an interconnect 1512 (e.g., trace, vias, pads) in an integrated device and/or a substrate. In some implementations, the first metal layer 1504 is removed such that a dimension (e.g., length, width) of the first metal layer 1504 underneath the second metal layer 1510 is about the same or smaller than a dimension (e.g., length, width) of the second metal layer 1510, which can result in an undercut, as shown at stage 5 of FIG. 15. In some implementations, the above mentioned processes may be iterated several times to provide and/or form several interconnects in one or more dielectric layers of an integrated device and/or substrate.

Figure 16:
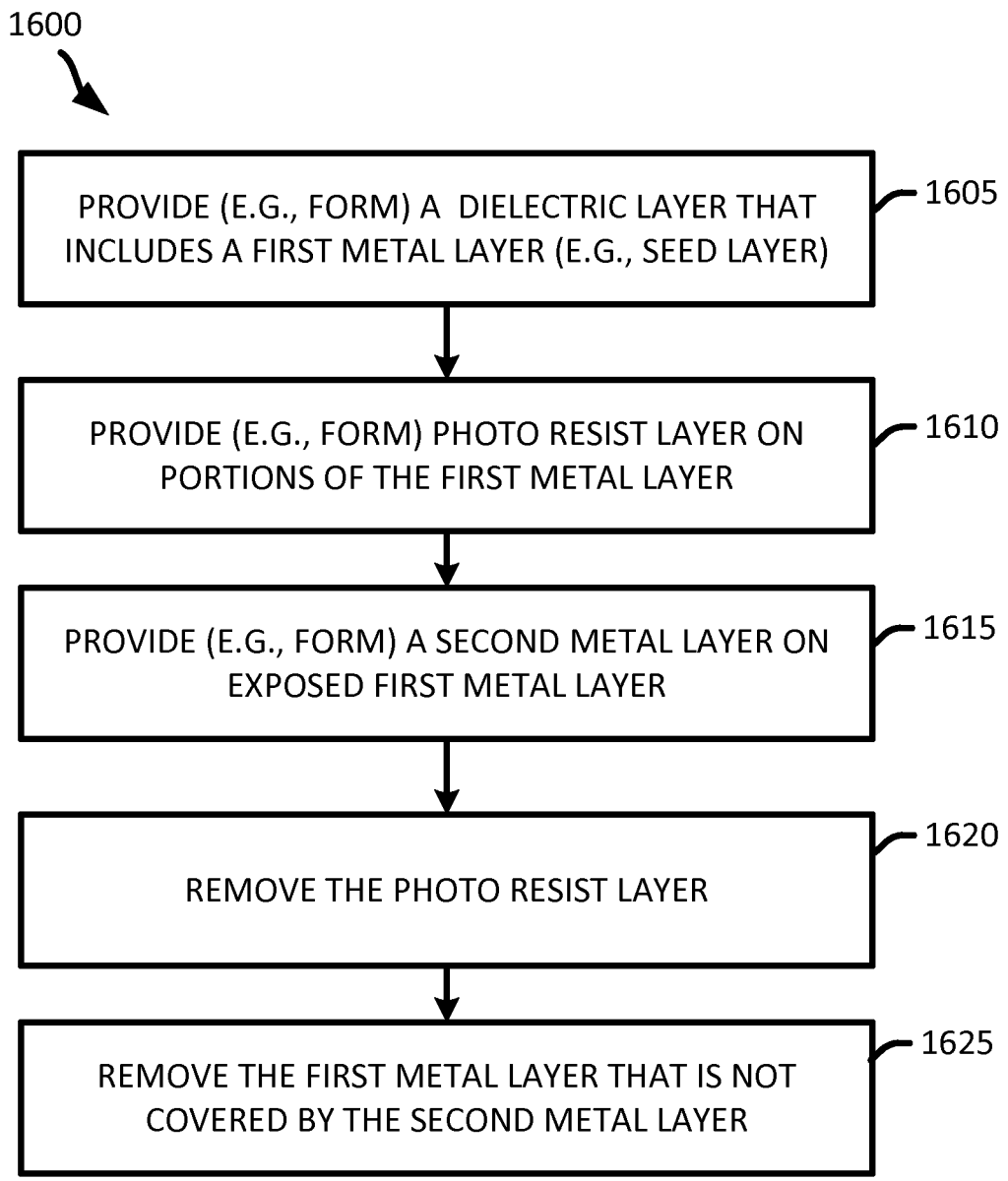
FIG. 16 illustrates an example of flow diagram of a semi-additive patterning (SAP) process.

FIG. 16 illustrates a flow diagram for a method for using a (SAP) process to provide and/or form an interconnect in one or more dielectric layer(s). The method provides (at 1605) a dielectric layer (e.g., dielectric layer 1502). In some implementations, providing the dielectric layer includes forming the dielectric layer. In some implementations, providing the dielectric layer includes forming a first metal layer (e.g., first metal layer 1504). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 1610) a photo resist layer (e.g., a photo develop resist layer 1506) on the first metal layer. In some implementations, selectively providing the resist layer includes providing a first resist layer on the first metal layer and selectively removing portions of the resist layer (which provides one or more cavities).

The method then provides (at 1615) a second metal layer (e.g., second metal layer 1510) in the cavity of the photo resist layer. In some implementations, the second metal layer is formed over an exposed portion of the first metal layer. In some implementations, the second metal layer is provided by using a deposition process (e.g., plating process).

The method further removes (at 1620) the resist layer. Different implementations may use different processes for removing the resist layer. The method also selectively removes (at 1625) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 17:
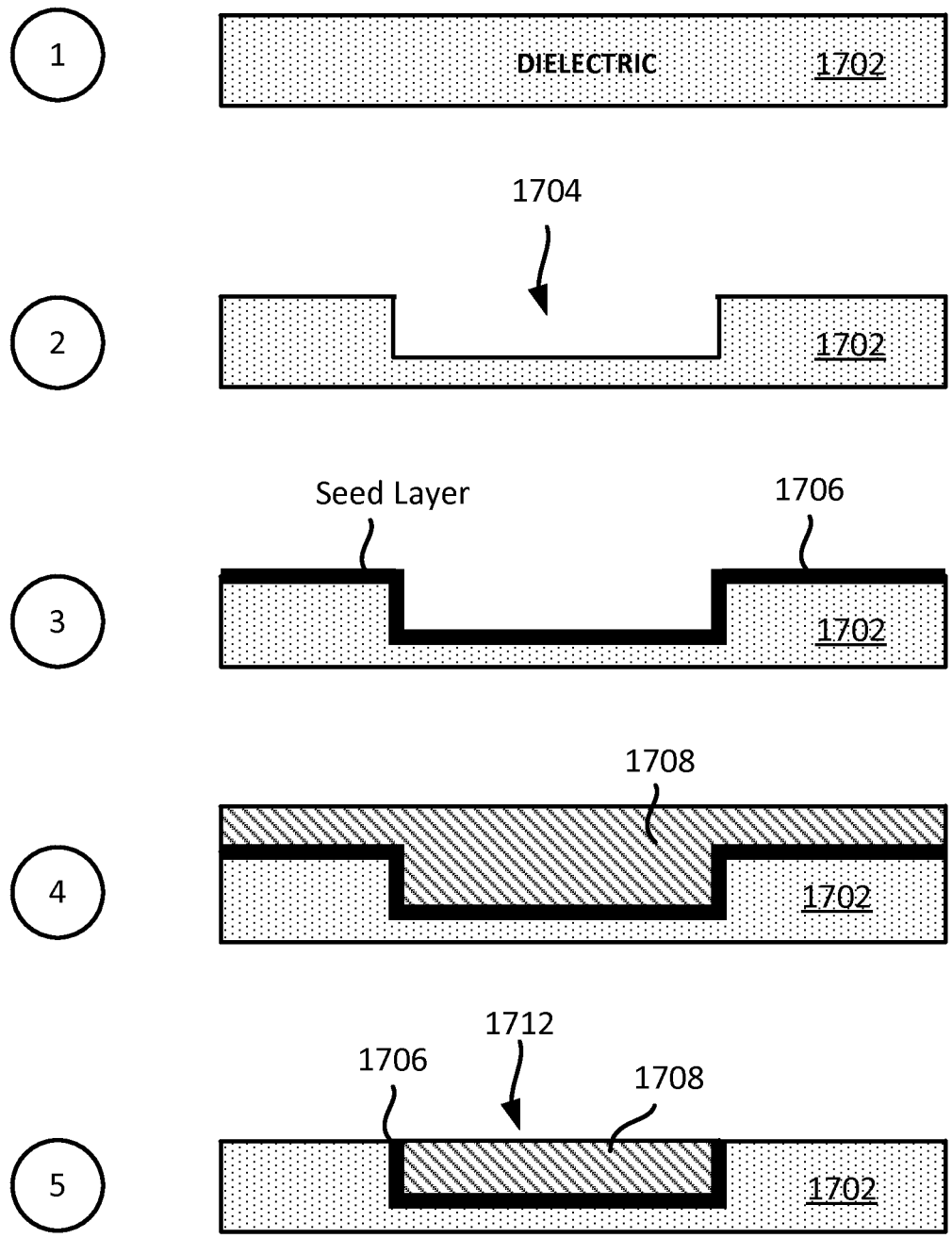
FIG. 17 illustrates an example of a damascene process.

FIG. 17 illustrates a sequence for forming an interconnect using a damascene process to provide and/or form an interconnect in a dielectric layer. As shown in FIG. 17, stage 1 illustrates a state of an integrated device after a dielectric layer 1702 is provided (e.g., formed). In some implementations, the dielectric layer 1702 is an inorganic layer (e.g., inorganic film).

Stage 2 illustrates a state of an integrated device after a cavity 1704 is formed in the dielectric layer 1702. Different implementations may use different processes for providing the cavity 1704 in the dielectric layer 1702.

Stage 3 illustrates a state of an integrated device after a first metal layer 1706 is provided on the dielectric layer 1702. As shown in stage 3, the first metal layer 1706 provided on a first surface of the dielectric later 1702. The first metal layer 1706 is provided on the dielectric layer 1702 such that the first metal layer 1706 takes the contour of the dielectric layer 1702 including the contour of the cavity 1704. The first metal layer 1706 is a seed layer in some implementations. In some implementations, the first metal layer 1706 is provided by using a deposition process (e.g., physical vapor deposition (PVD), Chemical Vapor Deposition (CVD) or plating process).

Stage 4 illustrates a state of the integrated device after a second metal layer 1708 is formed in the cavity 1704 and a surface of the dielectric layer 1702. In some implementations, the second metal layer 1708 is formed over an exposed portion of the first metal layer 1706. In some implementations, the second metal layer 1708 is provided by using a deposition process (e.g., plating process).

Stage 5 illustrates a state of the integrated device after the portions of the second metal layer 1708 and portions of the first metal layer 1706 are removed. Different implementations may use different processes for removing the second metal layer 1708 and the first metal layer 1706. In some implementations, a chemical mechanical planarization (CMP) process is used to remove portions of the second metal layer 1708 and portions of the first metal layer 1706. As shown in stage 5, the remaining first metal layer 1706 and the second metal layer 1708 may form and/or define an interconnect 1712 (e.g., trace, vias, pads) in an integrated device and/or a substrate. As shown in stage 5, the interconnect 1712 is formed in such a way that the first metal layer 1706 is formed on the base portion and the side portion(s) of the second metal layer 1708. In some implementations, the cavity 1704 may include a combination of trenches and/or holes in two levels of dielectrics so that via and interconnects (e.g., metal traces) may be formed in a single deposition step. In some implementations, the above mentioned processes may be iterated several times to provide and/or form several interconnects in one or more dielectric layers of an integrated device and/or substrate.

Figure 18:
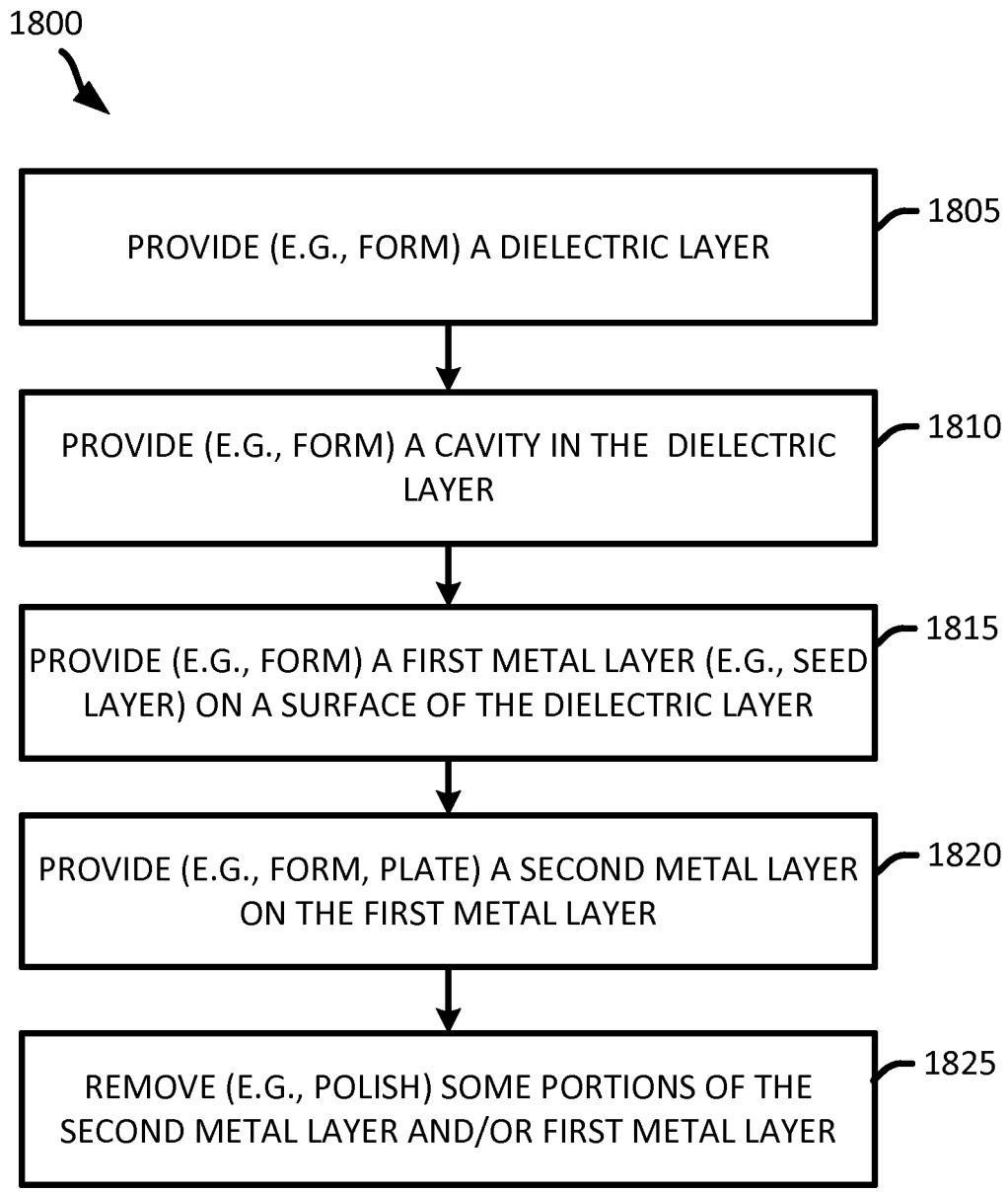
FIG. 18 illustrates an example of a flow diagram of a damascene process.

FIG. 18 illustrates a flow diagram of a method 1800 for forming an interconnect using a damascene process to provide and/or form an interconnect in a dielectric layer. The method provides (at 1805) a dielectric layer (e.g., dielectric layer 1702). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 1810) at least one cavity (e.g., cavity 1704) in the dielectric layer. Different implementations may use different processes for providing the cavity in the dielectric layer.

The method provides (at 1815) a first metal layer (e.g., first metal layer 1706) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 1706 is provided by using a deposition process (e.g., PVD, CVD or plating process).

The method provides (at 1820) a second metal layer (e.g., second metal layer 1708) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 1825) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 1712). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 19:
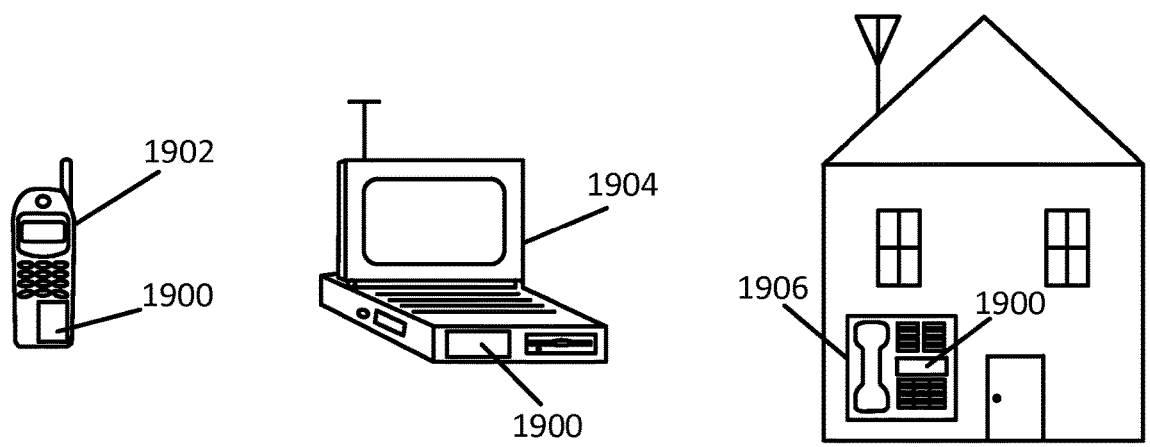
FIG. 19 illustrates various electronic devices that may integrate a semiconductor device, a die, an integrated circuit and/or PCB described herein.

FIG. 19 illustrates various electronic devices that may be integrated with any of the aforementioned integrated device, semiconductor device, integrated circuit, die, interposer, package or package-on-package (PoP). For example, a mobile telephone 1902, a laptop computer 1904, and a fixed location terminal 1906 may include an integrated device 1900 as described herein. The integrated device 1900 may be, for example, any of the integrated circuits, dice, packages, package-on-packages described herein. The devices 1902, 1904, 1906 illustrated in FIG. 19 are merely exemplary. Other electronic devices may also feature the integrated device 1900 including, but not limited to, mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13A-13C, 14, 15, 16, 17, 18 and/or 19 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13A-13C, 14, 15, 16, 17, 18 and/or 19 and its corresponding description in the present disclosure is not limited to dies and/or ICs. In some implementations, FIGS. 2, 3, 4, 5, 6, 7, 8, 9, 10, 11, 12, 13A-13C, 14, 15, 16, 17, 18 and/or 19 and its corresponding description may be used to manufacture, create, provide, and/or produce integrated devices. In some implementations, an integrated device may include a die, a die package, an integrated circuit (IC), an integrated device package, a wafer, a semiconductor device, a package on package, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device package comprising:
    an encapsulation portion comprising:
        a first die;
        a first set of vias coupled to the first die;
        a second die;
        a second set of vias coupled to the second die;
        a bridge configured to provide an electrical path between the first die and the second die, the bridge coupled to the first die through the first set of vias, the bridge further coupled to the second die through the second set of vias, wherein the bridge comprises a set of bridge interconnects, a first bridge interconnect from the set of bridge interconnects comprising a width of about 2 microns (μm) or less, and/or two neighboring bridge interconnects from the set of bridge interconnects comprising a spacing of about 2 microns (μm) or less;
        an encapsulation layer at least partially encapsulating the first die, the second die, the bridge, the first set of vias, and the second set of vias; and
    a redistribution portion coupled to the encapsulation portion, the redistribution portion comprising:
        a set of redistribution interconnects; and
        at least one dielectric layer.

2. The integrated device package of claim 1, wherein the electrical path between the first die and the second die comprises the set of bridge interconnects in the bridge, the first set of vias and the second set of vias.

3. The integrated device package of claim 1, wherein the set of bridge interconnects comprises one of at least a trace, a via, and/or a pad.

4. The integrated device package of claim 1, further comprising:
    a third set of vias coupled to the first die and the set of redistribution interconnects; and
    a fourth set of vias coupled to the second die and the set of redistribution interconnects.

5. The integrated device package of claim 4, wherein the third set of vias and the fourth set of vias comprises a via density that is greater than a bridge interconnect density of the bridge.

6. The integrated device package of claim 1, wherein the encapsulation layer includes a photosensitive material.

7. The integrated device package of claim 1, wherein the integrated device package is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

8. An integrated device package comprising:
    an encapsulation portion comprising:
        a first die;
        a first set of vias coupled to the first die;
        a second die;
        a second set of vias coupled to the second die;
        a bridge means configured to provide an electrical path between the first die and the second die, the bridge means coupled to the first die through the first set of vias, the bridge means further coupled to the second die through the second set of vias, wherein the bridge means comprises a set of bridge interconnects, a first bridge interconnect from the set of bridge interconnects comprising a width of about 2 microns (μm) or less, and/or two neighboring bridge interconnects from the set of bridge interconnects comprising a spacing of about 2 microns (μm) or less;
        an encapsulation layer at least partially encapsulating the first die, the second die, the bridge means, the first set of vias, and the second set of vias; and
    a redistribution portion coupled to the encapsulation portion, the redistribution portion comprising:
        a set of redistribution interconnects; and
        at least one dielectric layer.

9. The integrated device package of claim 8, wherein the electrical path between the first die and the second die comprises the set of bridge interconnects in the bridge means, the first set of vias and the second set of vias.

10. The integrated device package of claim 8, wherein the set of bridge interconnects comprises one of at least a trace, a via, and/or a pad.

11. The integrated device package of claim 8, further comprising:
a third set of vias coupled to the first die and the set of redistribution interconnects; and
a fourth set of vias coupled to the second die and the set of redistribution interconnects.

12. The integrated device package of claim 11, wherein the third set of vias and the fourth set of vias comprises a via density that is greater than a bridge interconnect density of the bridge means.

13. The integrated device package of claim 8, wherein the encapsulation layer includes a photosensitive material.

14. The integrated device package of claim 8, wherein the integrated device package is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

15. A method for fabricating an integrated device package, comprising:
providing an encapsulation portion, wherein providing the encapsulation portion comprises:
providing a first die comprising a first set of vias;
providing a second die comprising a second set of vias;
coupling a bridge to the first die and the second die; the bridge configured to provide an electrical path between the first die and the second die, the bridge coupled to the first die through the first set of vias, the bridge further coupled to the second die through the second set of vias, wherein the bridge comprises a set of bridge interconnects, a first bridge interconnect from the set of bridge interconnects comprising a width of about 2 microns (μm) or less, and/or two neighboring bridge interconnects from the set of bridge interconnects comprising a spacing of about 2 microns (μm) or less;
forming an encapsulation layer to at least partially encapsulate the first die, the second die, the bridge, the first set of vias, and the second set of vias; and
forming a redistribution portion on the encapsulation portion, wherein forming the redistribution portion comprises:
forming a set of redistribution interconnects; and
forming at least one dielectric layer.

16. The method of claim 15, wherein the electrical path between the first die and the second die comprises the set of bridge interconnects in the bridge, the first set of vias and the second set of vias.

17. The method of claim 15, wherein the set of bridge interconnects comprises one of at least a trace, a via, and/or a pad.

18. The method of claim 15, wherein the first die comprises a third set of vias coupled to the set of redistribution interconnects, and the second die comprises a fourth set of vias coupled to the set of redistribution interconnects.

19. The method of claim 18, wherein the third set of vias and the fourth set of vias comprises a via density that is greater than a bridge interconnect density of the bridge.

20. The method of claim 15, wherein the encapsulation layer includes a photosensitive material.

21. The method of claim 15, wherein the integrated device package is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *